US012575118B2

(12) United States Patent
Hsiao et al.

(10) Patent No.: US 12,575,118 B2
(45) Date of Patent: Mar. 10, 2026

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Tsung-Chieh Hsiao, Shetou Township (TW); Hsiang-Ku Shen, Hsinchu City (TW); Yuan-Yang Hsiao, Taipei (TW); Wen-Chiung Tu, New Taipei City (TW); Chen-Chiu Huang, Taichung City (TW); Dian-Hau Chen, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 468 days.

(21) Appl. No.: 17/824,436

(22) Filed: May 25, 2022

(65) Prior Publication Data

US 2023/0387192 A1 Nov. 30, 2023

(51) Int. Cl.
H10D 1/00 (2025.01)
H10D 1/68 (2025.01)

(52) U.S. Cl.
CPC ............. H10D 1/042 (2025.01); H10D 1/714 (2025.01); *H10D 1/043* (2025.01)

(58) Field of Classification Search
CPC ......... H01L 28/40; H01L 28/55; H01L 28/56; H01L 28/57; H01L 28/60; H01L 28/65;
H01L 28/75; H01L 28/82; H01L 28/84;
H01L 28/86; H01L 28/87; H01L 28/88;
H01L 28/90; H01L 28/91; H01L 28/92
See application file for complete search history.

(56) References Cited

U.S. PATENT DOCUMENTS

| | | | | |
|---|---|---|---|---|
| 9,466,661 B2 * | 10/2016 | Triyoso | .................. | H10D 1/692 |
| 2013/0270675 A1 * | 10/2013 | Childs | .................... | H10D 1/692 |
| | | | | 257/532 |
| 2015/0294936 A1 | 10/2015 | Shen et al. | | |
| 2019/0148072 A1 | 5/2019 | Fox et al. | | |

(Continued)

FOREIGN PATENT DOCUMENTS

| | | |
|---|---|---|
| TW | 201320305 A | 5/2013 |
| TW | 201923972 A | 6/2019 |
| TW | 202008601 A | 2/2020 |

*Primary Examiner* — Fernando L Toledo
*Assistant Examiner* — Marshall Mu-Nuo Hatfield
(74) *Attorney, Agent, or Firm* — STUDEBAKER BRACKETT PLLC

(57) ABSTRACT

A method of manufacturing a semiconductor device includes forming a first conductive layer over a first insulating layer and forming a first dielectric layer over the first conductive layer. A second conductive layer is formed over a first portion of the first dielectric layer. A second dielectric layer is formed over the second conductive layer. A third conductive layer is formed over the second dielectric layer and the second portion of the first dielectric layer. A third dielectric layer is formed over the third conductive layer. A first conductive contact is formed contacting the first conductive layer. A second conductive contact is formed contacting the third conductive layer. The second conductive layer is an electrically floating layer.

20 Claims, 15 Drawing Sheets

(56) References Cited

U.S. PATENT DOCUMENTS

| 2020/0035779 | A1 |  | 1/2020 | Huang et al. |  |
| 2021/0082715 | A1 | * | 3/2021 | Rubloff | H10N 30/503 |
| 2021/0398896 | A1 |  | 12/2021 | Hsiao et al. |  |
| 2022/0068794 | A1 | * | 3/2022 | Welsh | H01L 23/5223 |
| 2022/0262789 | A1 | * | 8/2022 | Cao | H10D 1/692 |
| 2022/0384563 | A1 | * | 12/2022 | Kim | H01L 21/76805 |

* cited by examiner

SEMICONDUCTOR DEVICE AND MANUFACTURING METHOD THEREOF

BACKGROUND

Integrated circuits (ICs) are formed on semiconductor dies that include millions or billions of individual semiconductor devices. For example, transistor devices are configured to act as switches, and/or to produce power gains, so as to enable logical functionality for an IC chip (e.g., functionality to perform logic functions). IC chips often also include passive electronic devices, such as capacitors, resistors, inductors and the like. Passive devices are widely used to control chip characteristics (e.g., gain, time constants, and the like) so as to provide an integrated chip with a wide range of different functionalities (e.g., incorporating both analog and digital circuitry on the same die). Capacitors, such as metal-insulator-metal (MIM) capacitors, which include at least a top metal plate and a bottom metal plate separated by an insulating dielectric, are often implemented in ICs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
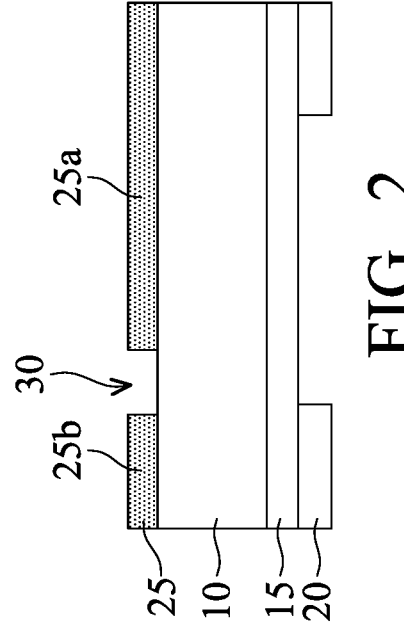
FIG. 1 shows a stage of a sequential manufacturing operation of a semiconductor device according to an embodiment of the present disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Metal insulator metal (MIM) capacitors are parallel plate capacitors formed by two metal layers with an intervening dielectric layer. MIM capacitors are desirable because they provide high capacitance while using little area of an integrated circuit. MIM capacitors are used for energy storage, signal filtering, and high-frequency tuning applications. MIM capacitors provide better reliability than other types of capacitors. In some semiconductor devices, a plurality of capacitors operating at different voltages are provided. One or more capacitors may be present in the core region of a semiconductor device and one or more capacitors may be present in an input/output (I/O) region of a semiconductor device. The I/O region is subjected to higher voltage in operation than the core region. Dielectric layers may be damaged by etching operations during device fabrication. Etch damaged dielectric layers may be more problematic in I/O regions due to the higher operating voltages of the I/O regions. Embodiments of the present disclosure limit or prevent damage to the dielectric layer during device fabrication. Embodiments of the present disclosure provide improved capacitance, reduced current leakage, increased breakdown voltage, and increased time dependent dielectric breakdown.

FIGS. 1-12 show various stages of a sequential manufacturing process of a MIM capacitor device according to embodiments of the present disclosure. It is understood that additional operations may be provided before, during, and after processes shown by FIGS. 1-12, and some of the operations described below can be replaced or eliminated in additional embodiments of the method. The order of the operations can be changed in some embodiments.

The MIM capacitors are formed over substrate 100, as shown in FIG. 1. In some embodiments, the substrate 100 includes a crystalline or amorphous glass, ceramic, or semiconductor material. In some embodiments, the substrate 100 is made of a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline Si. In some embodiments, the substrate 100 is a Si wafer. In some embodiments, one or more electronic devices, such as transistors 110, are formed over the substrate 100, and one or more interlayer dielectric (ILD) layers 105 are formed over the substrate to cover the electronic devices. Further, one or more metal wiring layers 115 or redistribution layers (RDL) are disposed in the ILD layers 105. In some embodiments, a first insulating layer 10 is disposed over the ILD layer 115 as shown in FIG. 1. In some embodiments, the first insulating layer 10 a crystalline or amorphous glass or ceramic material. In some embodiments the first insulating layer 10 is a silicon oxide, silicon nitride, or aluminum oxide, or a combination of oxide and nitride layers. The first insulating layer 10 may be formed by chemical vapor deposition (CVD), including plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD); atomic layer deposition (ALD), plasma-enhanced atomic layer deposition (PE-ALD), sputtering or other physical vapor deposition (PVD) techniques, or any suitable deposition technique.

In some embodiments, an etch stop layer 15 is formed over a lower surface of the first insulating layer 10, as shown in FIG. 1. The etch stop layer 15 is formed of a nitride in some embodiments. In some embodiments, the etch stop layer 15 is made of a silicon nitride, SiCN, or SiON. The etch stop layer may be formed by CVD, PE-CVD, MO-CVD, AP-CVD, LP-CVD, ALD, PE-ALD, sputtering or other PVD techniques, or any suitable deposition technique. In some embodiments, the etch stop layer 15 has a thickness ranging from about 10 nm to about 100 nm. At thicknesses below the disclosed range there may not be a sufficient etch stopping effect, and thicknesses greater than the disclosed range may not provide any additional significant benefit and may cause the size of the semiconductor device to become unnecessarily large and reduce device yield.

Contact pads 20 are formed at the surface region of the ILD layer 105 below the etch stop layer 15 in some embodiments as shown in FIG. 1. The contact pads 20 are made of a metal, such as aluminum, copper, nickel, tantalum, tungsten, silver, gold, platinum, or alloys thereof, in some embodiments. The contact pads 20 may be formed by depositing a metal layer over the ILD layer 105 by a suitable deposition technique, such as sputtering, electroplating, or any suitable metal deposition technique, followed by photolithographic patterning and etching to form a desired contact pad pattern or arrangement. In other embodiments, a damascene process is used to form the contact pads 20 embedded in the ILD layer 3. In some embodiments, the contact pads 20 make electrical contact with a redistribution layer.

A first conductive layer 25 is formed over a main surface of the first insulating layer 10 opposing the main surface of the first insulating layer 10 over which the etch stop layer 15 or contact pads 20 are formed. In some embodiments, the first conductive layer 25 is a metal layer. In some embodiments, the metal layers are made of a metal selected from the group consisting of Al, Cu, AlCu alloys, TiN, Ti, TaN, Ta, W, Co, Ni, and combinations thereof. The first conductive layer 25 may be formed by depositing a metal layer by a suitable deposition technique, such as CVD, sputtering, electroplating, or any suitable metal deposition technique. In some embodiments, the first conductive layer 25 is a first plate layer of a capacitor. In some embodiments, the first conductive layer 25 has a thickness ranging from about 10 nm to about 200 nm, and in other embodiments, has a thickness ranging from about 20 nm to about 100 nm. At thicknesses below the disclosed range there may not be sufficient conductivity of a subsequently formed capacitor plate, and thicknesses greater than the disclosed range may not provide any additional significant benefit and may cause the size of the semiconductor device to become unnecessarily large and reduce device yield.

Figure 2:
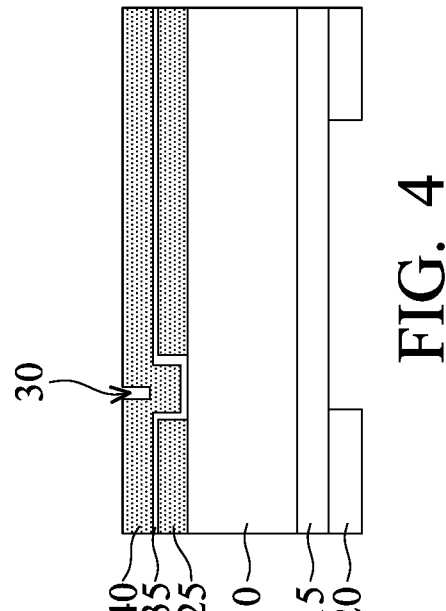
FIG. 2 shows a stage of a sequential manufacturing operation of a semiconductor device according to an embodiment of the present disclosure.

The substrate 100 and ILD layer 105 are not shown in FIGS. 2-12 to simplify the disclosure. The first conductive layer 25 is subsequently patterned to form an opening 30 to provide spaced apart first region 25a and second region 25b, as shown in FIG. 2. In some embodiments, the first conductive layer 25 is patterned using suitable photolithography and etching techniques. In some embodiments, suitable etching techniques for etching the first conductive layer include dry etching, including plasma based etching, and wet etching techniques. The first region 25a may form a first plate (or bottom plate) of a device, while the second region 25b may form another bottom plate of another device.

Figure 3:
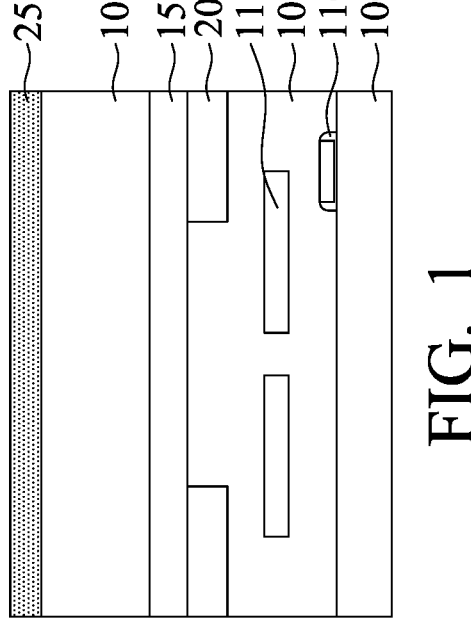
FIG. 3 shows a stage of a sequential manufacturing operation of a semiconductor device according to an embodiment of the present disclosure.

A first dielectric layer 35 is subsequently formed over the first 25a and second 25b regions of the first conductive layer, as shown in FIG. 3. The first dielectric layer 35 is formed in the opening 30, too, in some embodiments. The first dielectric layer 35 is a conformal layer having substantially the same thickness on horizontal and vertical surfaces in some embodiments. In some embodiments the dielectric layer 35 is made of a dielectric material, such as a silicon oxide or a high-k dielectric. In some embodiments, the dielectric layer 35 is made of silicon dioxide. In some embodiments, the high-k dielectric has a dielectric constant k of greater than 3.9. Examples of high-k dielectric material include hafnium oxide, hafnium silicon oxide, hafnium silicon oxynitride, hafnium tantalum oxide, hafnium titanium oxide, hafnium aluminum oxide, hafnium titanium oxide, hafnium zirconium oxide, zirconium oxide, zirconium aluminum oxide, aluminum oxide, titanium oxide, lanthanum oxide, hafnium dioxide-alumina ($HfO_2$—$Al_2O_3$) alloy, other suitable high-k dielectric materials, and/or combinations thereof. In some embodiments, the dielectric layer 35 includes multiple layers (not shown) of dielectric materials, such as a tri-layer structure having a first dielectric material layer disposed between two second dielectric material layers. In some embodiments, the tri-layer dielectric layer is a hafnium oxide/zirconium oxide/hafnium oxide, zirconium oxide/hafnium oxide/zirconium oxide, hafnium oxide/aluminum oxide/hafnium oxide, aluminum oxide/hafnium oxide/aluminum oxide, zirconium oxide/aluminum oxide/zirconium oxide, or aluminum oxide/zirconium oxide/aluminum oxide tri-layer structure. The dielectric layer 35 may be formed by chemical vapor deposition, atomic layer deposition, or any suitable method. The dielectric layer 35 has a thickness of about 1 nm to about 50 nm in some embodiments, and from about 2 nm to about 20 nm in other embodiments depending on design requirements. At thicknesses below the disclosed ranges there may be insufficient electrical insulation between plates. At thicknesses above the disclosed ranges there may be insufficient capacitance or the device may become unnecessarily large, thereby reducing device yield.

Figure 4:
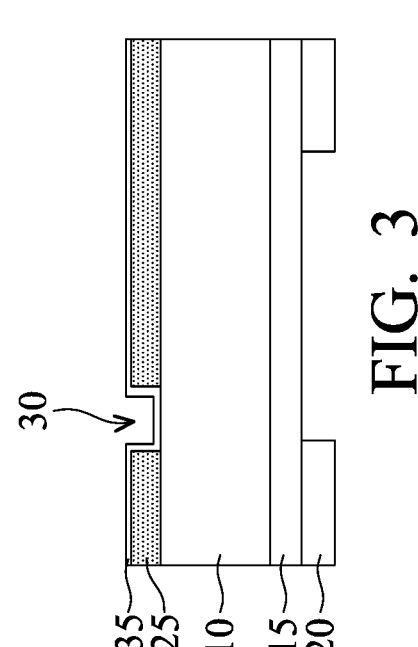
FIG. 4 shows a stage of a sequential manufacturing operation of a semiconductor device according to an embodiment of the present disclosure.

A second conductive layer 40 is subsequently formed over the first dielectric layer 35, as shown in FIG. 4. The second conductive layer 40 is conformally formed in some embodiments. The second conductive layer 40 may be formed of the same materials, to the same thicknesses, and in the same manner as the first conductive layer 25 disclosed herein.

Figure 5:
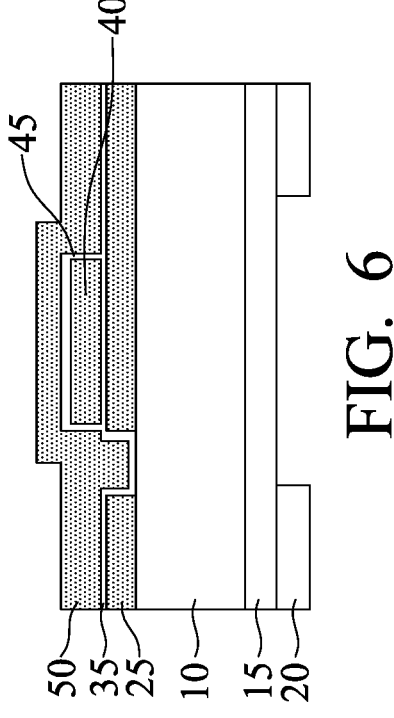
FIG. 5 shows a stage of a sequential manufacturing operation of a semiconductor device according to an embodiment of the present disclosure.

Next, the second conductive layer 40 is patterned to form a second plate over a first portion of the first dielectric layer 35, as shown in FIG. 5. In some embodiments, the second plate 40 is formed over only the first portion of the first dielectric layer 35. The second conductive layer 40 is removed from the other portion of the first dielectric layer 35 by suitable photolithography and etching operations.

Figure 6:
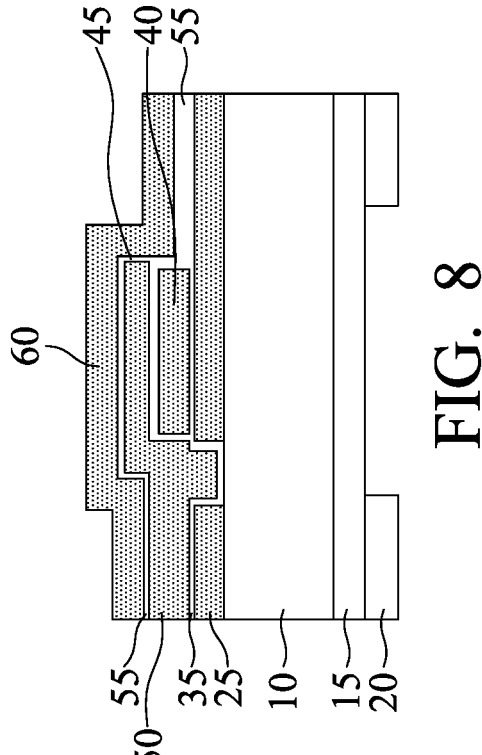
FIG. 6 shows a stage of a sequential manufacturing operation of a semiconductor device according to an embodiment of the present disclosure.

A second dielectric layer 45 is subsequently formed surrounding the second conductive layer 40, as shown in FIG. 6. The second dielectric layer 45 may be conformally formed over the second conductive layer 40 and the first dielectric layer 35. In some embodiments the portion of the second dielectric layer 45 disposed over the first dielectric layer is removed by suitable photolithography and etching operations. In some embodiments, the second dielectric layer 45 may remain overlying the first dielectric layer 35, thereby providing a thicker dielectric layer over those portions where two dielectric layers are formed. As shown, the second conductive layer (plate) 40 is surrounded on four sides or completely surrounded by dielectric layers 35, 45 when viewed in cross section. The second conductive layer 40 may be formed by the same materials, same operations, and to the same thicknesses disclosed herein with respect to the first conductive layer 25. In some embodiments, the material and thickness of the second conductive layer 40 is the same as the first conductive layer 25, in other embodiments, the material or thickness of the second conductive layer 40 is different from the first conductive layer 25 depending on design requirements. Then, a third conductive layer 50 is formed over the first and second dielectric layers 35, 45. The third conductive layer 50 may be formed by the same materials, same operations, and to the same thicknesses disclosed herein with respect to the first and second conductive layers 25, 40. In some embodiments, the material and thickness of the third conductive layer 50 is the same as the first conductive layer 25 or second conductive layer 40, in other embodiments, the material or thickness of the third conductive layer 50 is different from the first conductive layer 25 or second conductive layer 40 depending on design requirements.

Figure 7:
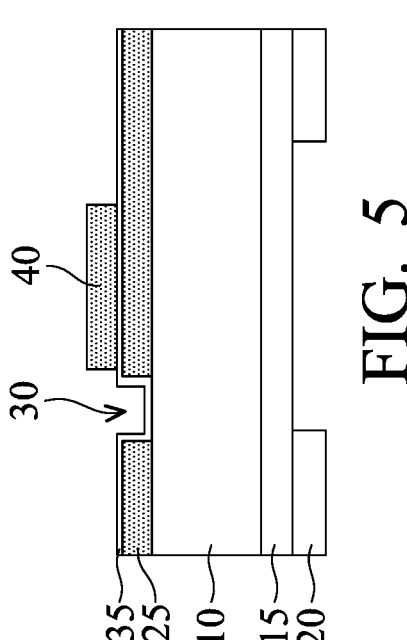
FIG. 7 shows a stage of a sequential manufacturing operation of a semiconductor device according to an embodiment of the present disclosure.

The third conductive layer 50 is subsequently patterned to form a third plate (or top plate), as shown in FIG. 7. Suitable photolithography and etching operations may be used to pattern the third conductive layer.

Figure 8:
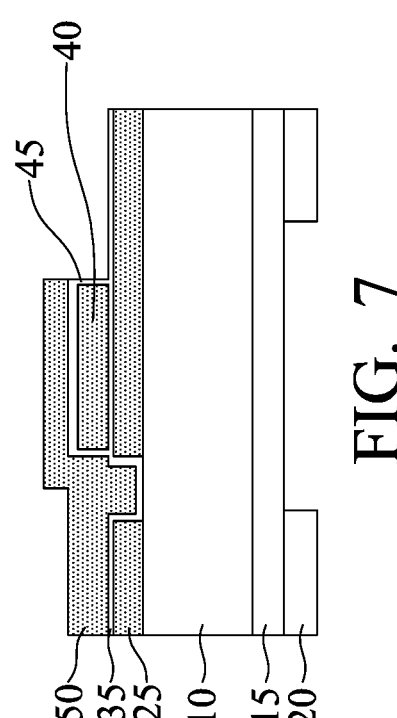
FIG. 8 shows a stage of a sequential manufacturing operation of a semiconductor device according to an embodiment of the present disclosure.

A third dielectric layer 55 is then formed over the third conductive layer 50, as shown in FIG. 8. In some embodiments, the third dielectric layer 55 is also formed over a portion of the first dielectric layer 35. Where the third dielectric layer 55 is formed over the first dielectric layer 35 the combined thickness of the dielectric layers is greater than either the first dielectric layer 35 or third dielectric layer 55 alone. In some embodiments, where the third dielectric layer 55 overlaps the first dielectric layer 35, the combined thickness of the dielectric layers is about the twice the thickness of the first dielectric layer 35. Then, in some embodiments, a fourth conductive layer 60 is formed over the third dielectric layer 55. The fourth conductive layer 60 and the third dielectric layer 55 are conformal layers in some embodiments. The third dielectric layer 55 may be formed by the same materials, same operations, and to the same thicknesses disclosed herein with respect to the first and second dielectric layers 35, 45. And the fourth conductive layer 60 may be formed by the same materials, same operations, and to the same thicknesses as the first, second, and third conductive layers 25, 40, 50. In some embodiments, the third dielectric layer is made of different materials or to different thicknesses than the first or second dielectric layers 35, 45. In some embodiments, the fourth conductive layer is made of different materials or to different thicknesses than the first, second, or third conductive layers 25, 40, 50.

Figure 9:
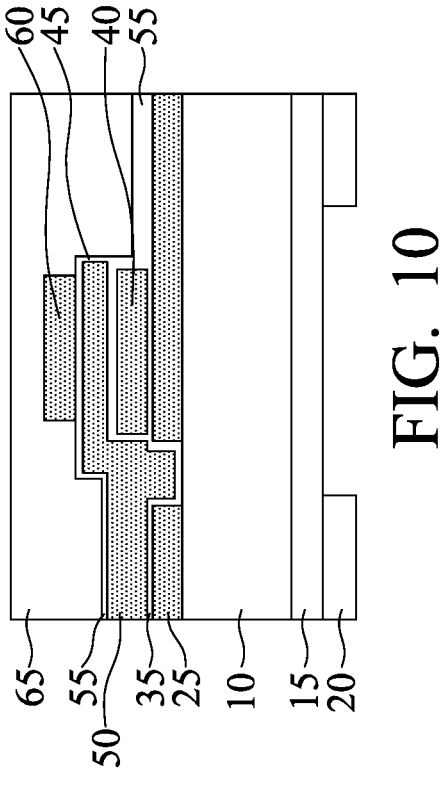
FIG. 9 shows a stage of a sequential manufacturing operation of a semiconductor device according to an embodiment of the present disclosure.

The fourth conductive layer 60 is then patterned, in some embodiments, to form a fourth plate, as shown in FIG. 9. In some embodiments, the fourth plate 60 is formed over the first portion of the first region of the first conductive layer 25. In some embodiments, the fourth plate 60 is located over and is substantially vertically aligned with the second plate 40. The fourth plate 60 is used in the core region of semiconductor devices in some embodiments where there is a higher capacitance requirement. On the other hand, in input/output regions, where there is a lower capacitance requirement, the fourth plate is not included in some embodiments.

Figure 10:
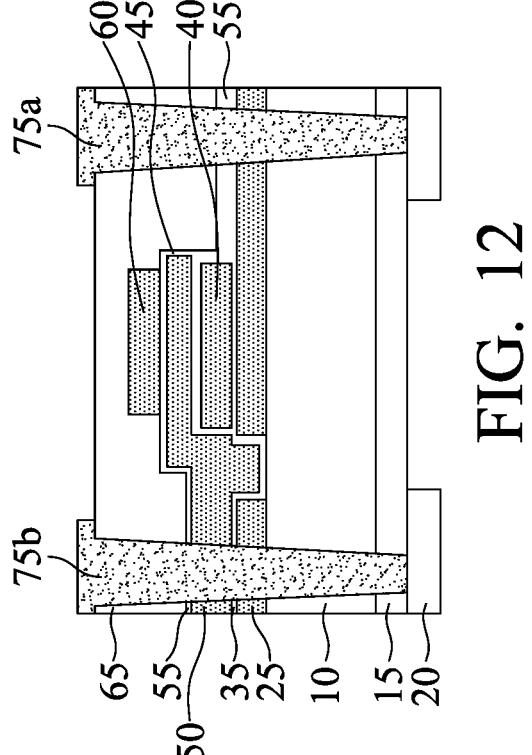
FIG. 10 shows a stage of a sequential manufacturing operation of a semiconductor device according to an embodiment of the present disclosure.

A second insulating layer (or upper insulating layer) 65 is formed over third dielectric layer 55 or the fourth conductive layer 60 in some embodiments, as shown in FIG. 10. The second insulating layer 65 is an oxide or a nitride. In some embodiments, the second insulating layer 65 is made of silicon oxide, silicon nitride, or aluminum oxide formed by CVD, ALD, or MOCVD. In some embodiments, the second insulating layer 65 is a spin-on glass (SOG), a fluorosilicate glass, an organosilicate glass, a spin-on organic polymer dielectric, or a spin-on silicon based polymeric dielectric. In some embodiments, the upper surface of the second insulating layer 65 is planarized by a chemical-mechanical polishing (CMP) operation or an etch back operation.

Figure 11:
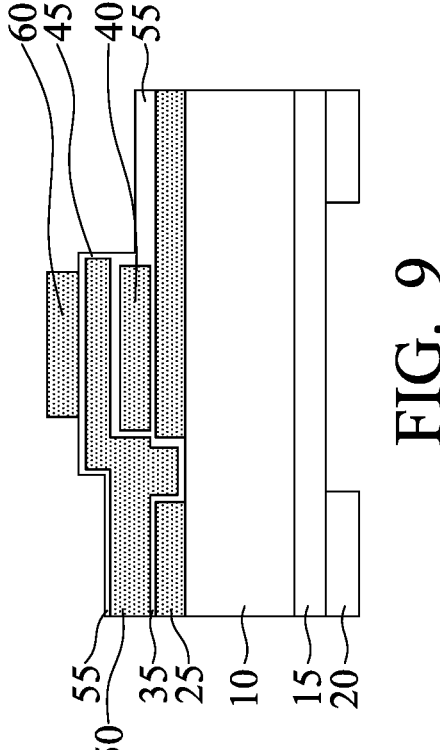
FIG. 11 shows a stage of a sequential manufacturing operation of a semiconductor device according to an embodiment of the present disclosure.

In some embodiments, first and second openings 70a, 70b are formed in the device structure by suitable etching operations. As shown in FIG. 11, the openings 70a, 70b extend to the contact pads 20. By using suitable wet or dry etching operations, the upper insulating layer 65, first and third dielectric layers 35, 55, first and third conductive layers 25, 40, first insulating layer (or lower insulating layer) 10, and etch stop layer 15 are etched. Different etchants, selective to each layer being etched, are used in some embodiments.

Figure 12:
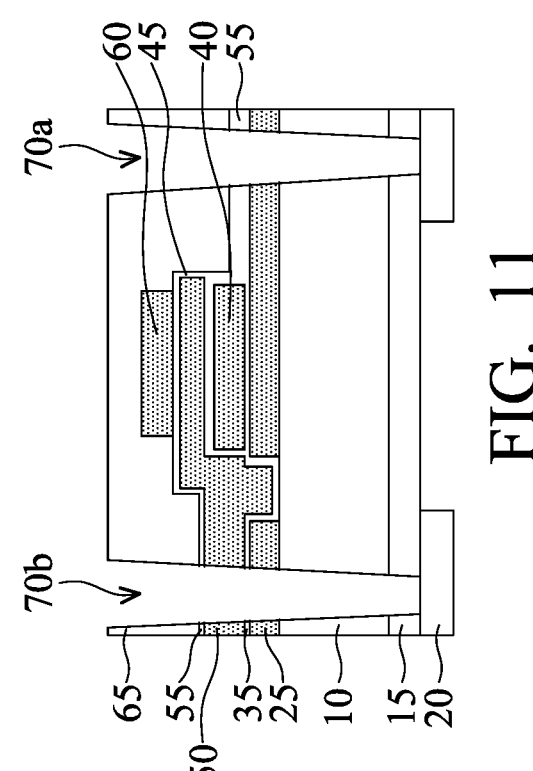
FIG. 12 shows a stage of a sequential manufacturing operation of a semiconductor device according to an embodiment of the present disclosure.

The openings 70a, 70b are subsequently filled with a conductive material to form conductive vias 75a, 75b, as shown in FIG. 12. In some embodiments, the conductive material is a metal. In some embodiments, the metal is selected from the group consisting of Al, Cu, W, Ta, Ti, Ni, and alloys thereof. The metal may be deposited in the openings 70a, 70b by a suitable technique, including sputtering, CVD, ALD, electroplating, or thermal evaporation, etc.

In FIG. 12, a MIM capacitor is formed between the second conductive via 75b and the third plate 50 and the first conductive via 75a and the first plate 25 with the dielectric layers 35 and 45 therebetween. The first conductive via 75a is in electrical contact with the first plate 25, the second conductive via 75b is in electrical contact with the third plate 50, and the second plate 40 is not in electrical contact with either the first or second conductive via, and is electrically floating. In the present embodiment, such an electrically floating second plate 40 is inserted within in a MIM capacitor. In some embodiments, a planarizing operation is subsequently performed on metal deposited on top of the upper insulating layer 65. In some embodiments, after the metal is deposited in the openings, a patterning operation is performed using suitable photolithography and etching operations to form contact pads on the upper surface of the insulating layer 65.

FIGS. 13-21 show various stages of a sequential manufacturing process of a MIM capacitor device according to embodiments of the present disclosure. It is understood that additional operations may be provided before, during, and after processes shown by FIGS. 13-21, and some of the operations described below can be replaced or eliminated in additional embodiments of the method. The order of the operations can be changed in some embodiments.

Figure 13:
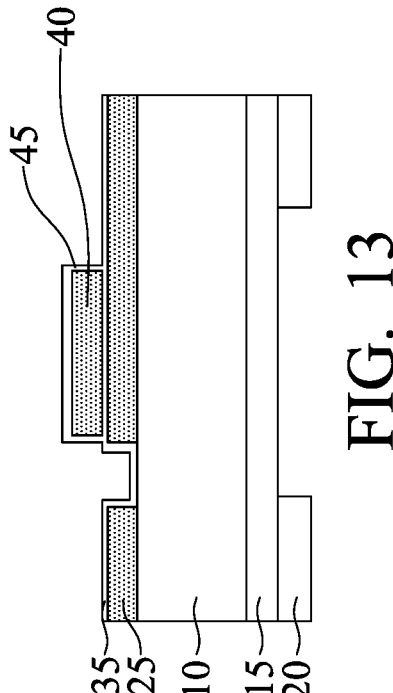
FIG. 13 shows a stage of a sequential manufacturing operation of a semiconductor device according to an embodiment of the present disclosure.
Figure 14:
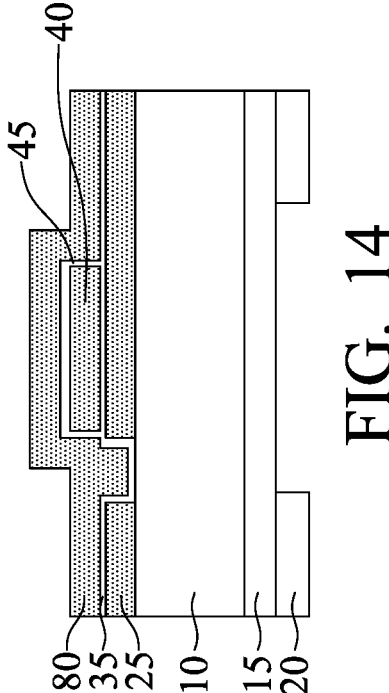
FIG. 14 shows a stage of a sequential manufacturing operation of a semiconductor device according to an embodiment of the present disclosure.

In some embodiments, after forming the structure depicted in FIG. 5, a second dielectric layer 45 is formed over the second plate 40, as shown in FIG. 13. The second dielectric layer 45 may be conformally formed over the second conductive layer 40 and the first dielectric layer 35, and then the portion of the second dielectric layer 45 disposed over the first dielectric layer may be removed by suitable photolithography and etching operations. In some embodiments, the second dielectric layer 45 may remain overlying the first dielectric layer 35, thereby providing a thicker dielectric layer over those portions where two dielectric layers are formed. As shown, the second conductive layer 40 is surrounded on four sides or completely surrounded by dielectric layers 35, 45 when viewed in cross section. The second conductive layer 40 may be formed by the same materials, same operations, and to the same thicknesses disclosed herein with respect to the first conductive layer 25. In some embodiments, the material and thickness of the second conductive layer 40 is the same as the first conductive layer 25, in other embodiments, the material or thickness of the second conductive layer 40 is different from the first conductive layer 25 depending on design requirements. Then, a third conductive layer 80 is formed over the first and second dielectric layers 35, 45, as shown in FIG. 14. The third conductive layer 80 may be formed by the same materials, same operations, and to the same thicknesses disclosed herein with respect to the first and second conductive layers 25, 40. In some embodiments, the material and thickness of the third conductive layer 80 is the same as the first conductive layer 25 or second conductive layer 40, in other embodiments, the material or thickness of the third conductive layer 80 is different from the first conductive layer 25 or second conductive layer 40 depending on design requirements.

Figure 15:
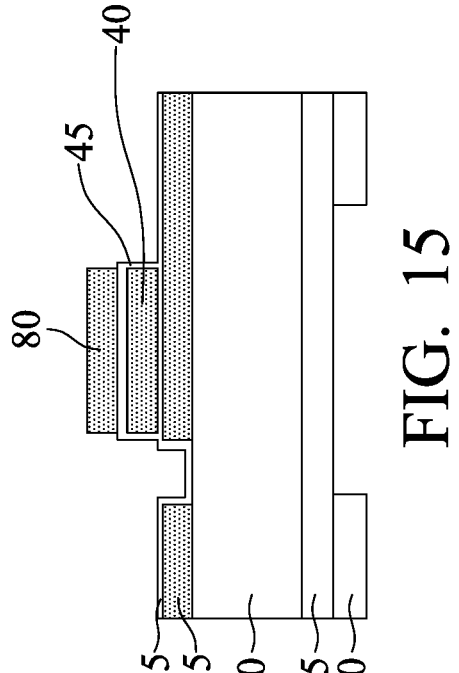
FIG. 15 shows a stage of a sequential manufacturing operation of a semiconductor device according to an embodiment of the present disclosure.

The third conductive layer 80 is subsequently patterned to form a third plate (or top plate), as shown in FIG. 15. Suitable photolithography and etching operations may be used to pattern the third conductive layer. In some embodiments, the third plate 80 has about the same length as the second plate 40. In some embodiments, the third plate 80 is substantially vertically aligned with the second plate 40.

Figure 16:
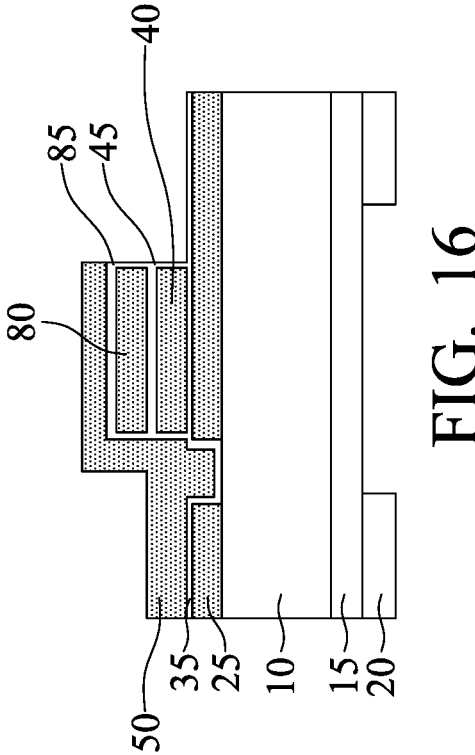
FIG. 16 shows a stage of a sequential manufacturing operation of a semiconductor device according to an embodiment of the present disclosure.

A third dielectric layer 85 is then formed over the third conductive layer 80 and then a fourth conductive layer 50 is formed over the third dielectric layer 85 and patterned to form a fourth plate, as shown in FIG. 16. As shown, the third plate 80 is surrounded on four sides or completely surrounded by dielectric layers 85, 45 when viewed in cross section. Then, a fourth conductive layer 50 is formed over the third dielectric layer 85. The fourth conductive layer 50 and the third dielectric layer 85 are conformal layers in some embodiments. The third dielectric layer 85 may be formed by the same materials, same operations, and to the same thicknesses disclosed herein with respect to the first and second dielectric layers 35, 45. The fourth conductive layer 50 may be formed by the same materials, same operations, and to the same thicknesses as the first, second, and third conductive layers 25, 40, 80. In some embodiments, the third dielectric layer 85 is made of different materials or to different thicknesses than the first or second dielectric layers 35, 45. In some embodiments, the fourth conductive layer 50 is made of different materials or to different thicknesses than the first, second, or third conductive layers 25, 40, 80. The fourth conductive layer 50 is then patterned, in some embodiments, to form a fourth plate.

Figure 17:
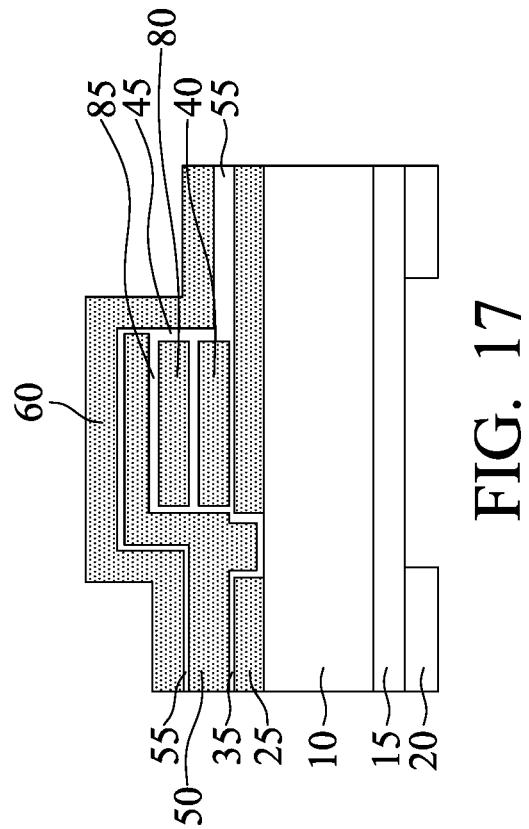
FIG. 17 shows a stage of a sequential manufacturing operation of a semiconductor device according to an embodiment of the present disclosure.

A fourth dielectric layer 55 is then formed over the fourth conductive layer 50 and then a fifth conductive layer 60 is formed over the fourth dielectric layer 55, as shown in FIG. 17. In some embodiments, the fourth dielectric layer 55 is also formed over a portion of the first dielectric layer 35. Where the fourth dielectric layer 55 is formed over the first dielectric layer 35 the combined thickness of the dielectric layers is greater than either the first dielectric layer 35 or fourth dielectric layer 55 alone. In some embodiments, where the fourth dielectric layer 55 overlaps the first dielectric layer 35, the combined thickness of the dielectric layers is about the twice the thickness of the first dielectric layer 35.

Figure 18:
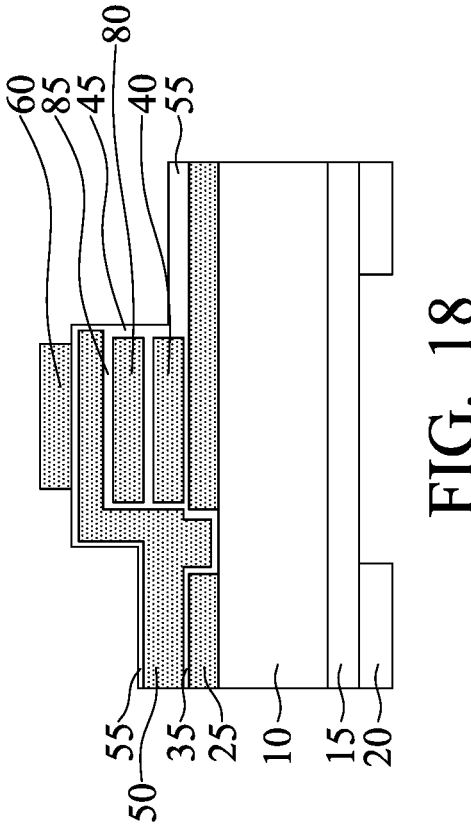
FIG. 18 shows a stage of a sequential manufacturing operation of a semiconductor device according to an embodiment of the present disclosure.

Then, a fifth conductive layer 60 is formed over the fourth dielectric layer 55 in some embodiments. The fifth conductive layer 60 and the fourth dielectric layer 55 are conformal layers in some embodiments. The fourth dielectric layer 55 may be formed by the same materials, same operations, and to the same thicknesses disclosed herein with respect to the first, second, and third dielectric layers 35, 45, 85. The fifth conductive layer 60 may be formed by the same materials, same operations, and to the same thicknesses as the first, second, third, and fourth conductive layers 25, 40, 80, 50. In some embodiments, the fourth dielectric layer 55 is made of different materials or to different thicknesses than the first, second, or third dielectric layers 35, 45, 85. In some embodiments, the fifth conductive layer 60 is made of different materials or to different thicknesses than the first, second, third, or fourth conductive layers 25, 40, 80, 50. The fifth conductive layer 60 is then patterned, in some embodiments, to form a fourth plate, as shown in FIG. 18. In some embodiments, the fifth plate 60 is located over and is substantially vertically aligned with the second plate 40 or the third plate 80.

Figure 19:
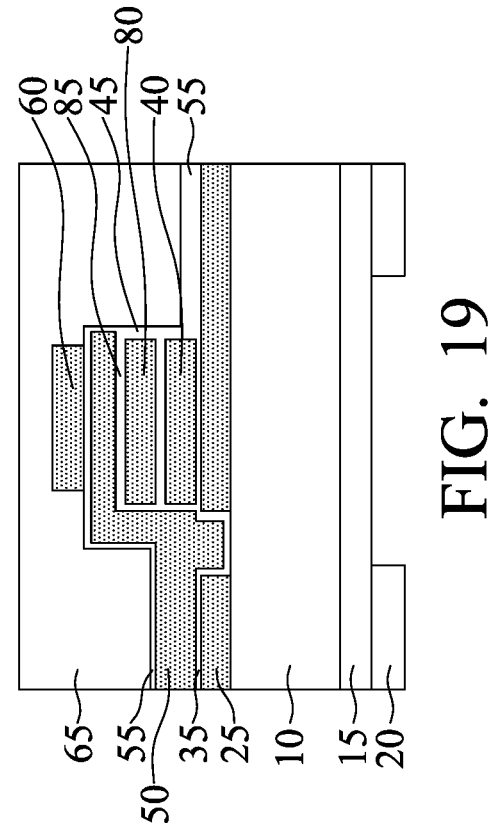
FIG. 19 shows a stage of a sequential manufacturing operation of a semiconductor device according to an embodiment of the present disclosure.

A second insulating layer (or upper insulating layer) 65 is formed over fourth dielectric layer 55 or the fifth conductive layer 60 in some embodiments, as shown in FIG. 19. The second insulating layer 65 is an oxide or a nitride. In some embodiments, the second insulating layer is made of silicon oxide, silicon nitride, or aluminum oxide formed by CVD, ALD, or MOCVD. In some embodiments, the upper surface of the insulating layer 65 is planarized by a chemical-mechanical polishing (CMP) operation or an etch back operation.

Figure 20:
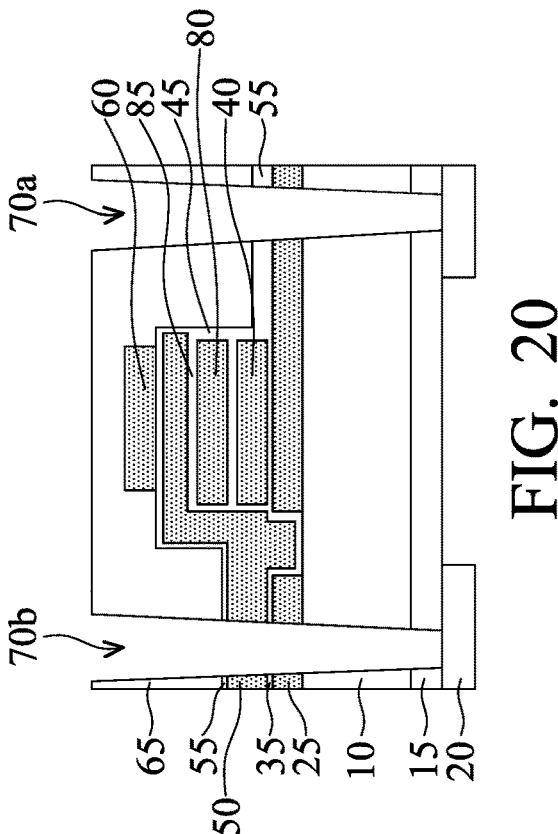
FIG. 20 shows a stage of a sequential manufacturing operation of a semiconductor device according to an embodiment of the present disclosure.

In some embodiments, first and second openings 70a, 70b are formed in the device structure by suitable etching operations. As shown in FIG. 20, the openings 70a, 70b extend to the contact pads 20. By using suitable wet or dry etching operations, the upper insulating layer 65, first and fourth dielectric layers 35, 55, first and fourth conductive layers 25, 40, first insulating layer 10, and etch stop layer 15 are etched. Different etchants, selective to each layer being etched, are used in some embodiments.

Figure 21:
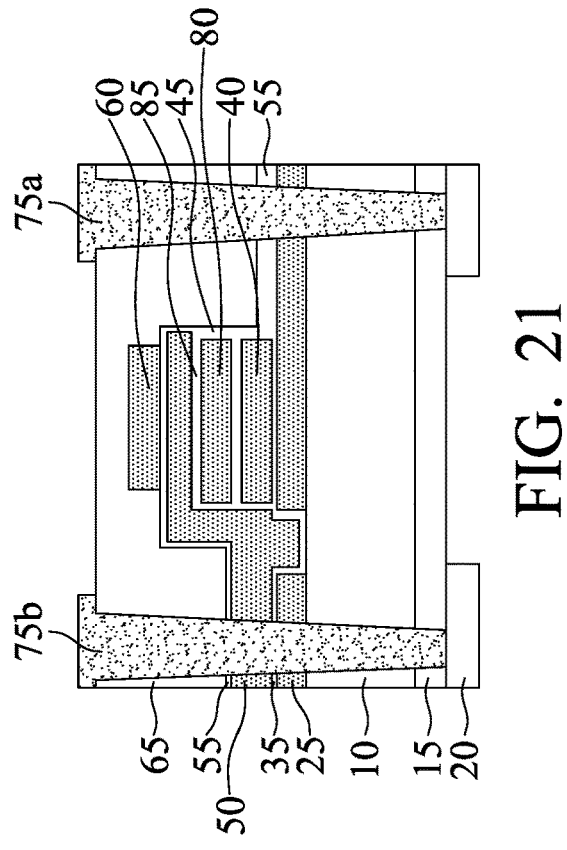
FIG. 21 shows a stage of a sequential manufacturing operation of a semiconductor device according to an embodiment of the present disclosure.

The openings 70a, 70b are subsequently filled with a conductive material to form conductive vias 75a, 75b, as shown in FIG. 21. In some embodiments, the conductive material is a metal. In some embodiments, the metal is selected from the group consisting of Al, Cu, W, Ta, and alloys thereof. The metal may be deposited in the openings 70a, 70b by a suitable technique, including sputtering, CVD, ALD, electroplating, or thermal evaporation, etc. The first conductive via 75a is in electrical contact with the first plate 25 (or bottom plate), the second conductive via 75b is in electrical contact with the fourth plate 50 (or top plate), and the second plate 40 and third plate 80 are not in electrical contact with either the first or second conductive via, and are electrically floating. In the present embodiment, two electrically floating plates 40, 80 are inserted within in an MIM capacitor. In some embodiments, a planarizing operation is subsequently performed on metal deposited on top of the upper insulating layer 65. In some embodiments, after the metal is deposited in the openings, a patterning operation is performed using suitable photolithography and etching operations to form contact pads on the upper surface of the insulating layer 65.

In some embodiments, three or more floating plates are formed between the bottom plate 25 and the top plate 50. In some embodiments, the number of floating plates ranges from 1 to 10 floating plates between the bottom and top plates, while in other embodiments, the number of floating plates ranges from 2 to 5. While two or more floating plates between the bottom plate 25 and the top plate 50 provide a higher breakdown voltage, multiple floating plates results in a lower capacitance than one floating plate between the bottom and top plates.

FIGS. 22-33 show various stages of a sequential manufacturing process of a plurality of MIM capacitor devices according to embodiments of the present disclosure. It is understood that additional operations may be provided before, during, and after processes shown by FIGS. 22-33, and some of the operations described below can be replaced or eliminated in additional embodiments of the method. The order of the operations can be changed in some embodiments.

Figure 22:
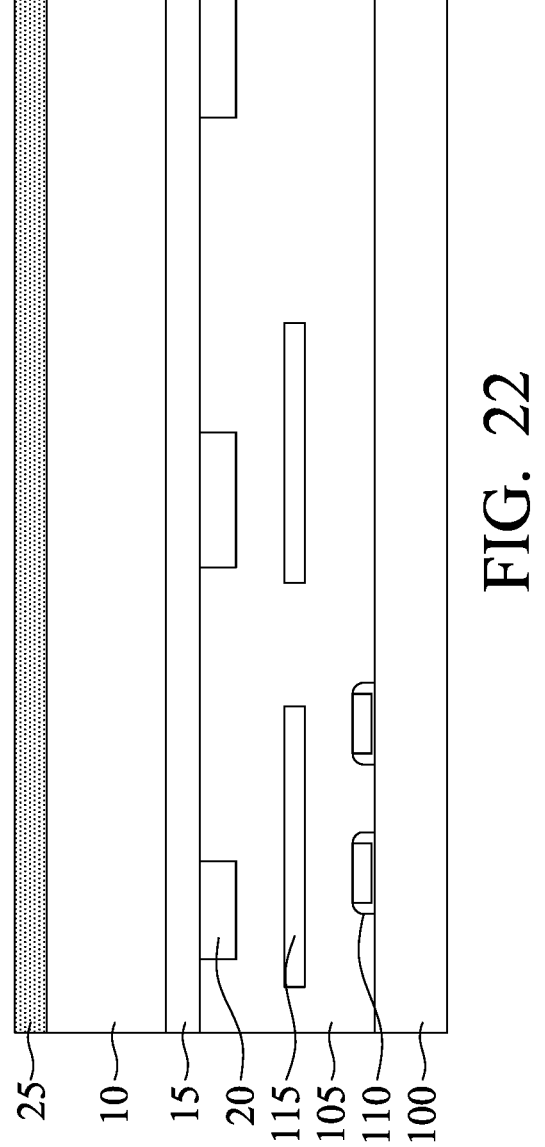
FIG. 22 shows a stage of a sequential manufacturing operation of a semiconductor device according to an embodiment of the present disclosure.

The MIM capacitors are formed over substrate 100, as shown in FIG. 22. The substrate 100 may be any of the materials disclosed herein in reference to FIG. 1. In some embodiments, one or more electronic devices, such as transistors 110, are formed over the substrate 100, and one or more interlayer dielectric (ILD) layers 105 are formed over the substrate to cover the electronic devices. Further, one or more metal wiring layers 115 or redistribution layers (RDL) are disposed in the ILD layers 105. In some embodiments, a first insulating layer 10 is disposed over the ILD layer 115 as shown in FIG. 22. The first insulating layer 10 may be formed of any of the materials and by any of the techniques disclosed herein in reference to the first insulating layer 10 in FIG. 1. In some embodiments, an etch stop layer 15 is formed over a lower surface of the first insulating layer 10, as shown in FIG. 22. The etch stop layer 15 may be formed of the same materials, by the same operations, and to the same thicknesses disclosed herein with respect to FIG. 1. Contact pads 20 are formed over the etch stop layer 15 in some embodiments. The contact pads 20 may be formed of the same materials and by the same operations disclosed herein with respect to FIG. 1. A first conductive layer 25 is formed over a main surface of the first insulating layer 10 opposing the main surface of the first insulating layer 10 over which the etch stop layer 15 or contact pads 20 are formed. The first conductive layer 25 may be formed of the same materials, by the same operations, and to the same thicknesses disclosed herein reference to FIG. 1.

Figure 23:
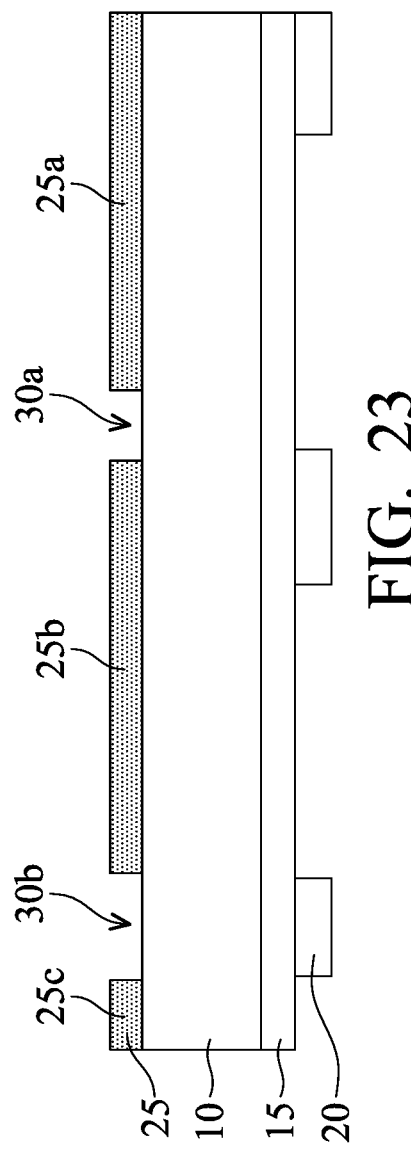
FIG. 23 shows a stage of a sequential manufacturing operation of a semiconductor device according to an embodiment of the present disclosure.

The first conductive layer 25 is subsequently patterned to form a plurality of openings 30a, 30b to provide spaced apart first 25a, second 25b, and third 25c regions, as shown in FIG. 23. The substrate 100 and ILD layer 105 are not shown in FIGS. 23-33 to simplify the disclosure. In some embodiments, the first conductive layer 25 is patterned using suitable photolithography and etching techniques. The first region 25a, second region 25b, and third region 25c may form bottom plates of first, second, and third capacitor devices.

Figure 24:
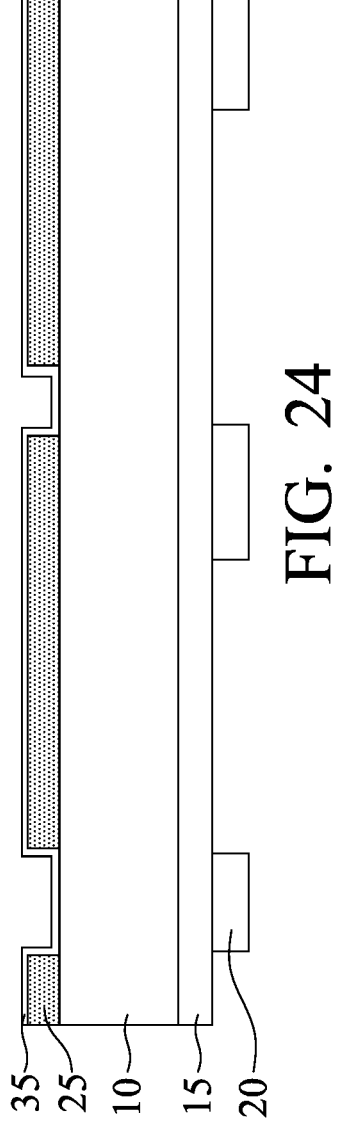
FIG. 24 shows a stage of a sequential manufacturing operation of a semiconductor device according to an embodiment of the present disclosure.

A first dielectric layer 35 is subsequently formed over the first 25a, second 25b, and third 25c regions of the first conductive layer, as shown in FIG. 24. The first dielectric layer 35 is formed in the openings 30a, 30b in some embodiments. The first dielectric layer 35 is a conformal layer having substantially the same thickness on horizontal and vertical surfaces in some embodiments. The first dielectric layer 35 may be formed of the same materials, by the same operations, and to the same thicknesses as disclosed herein in reference to FIG. 3.

Figure 25:
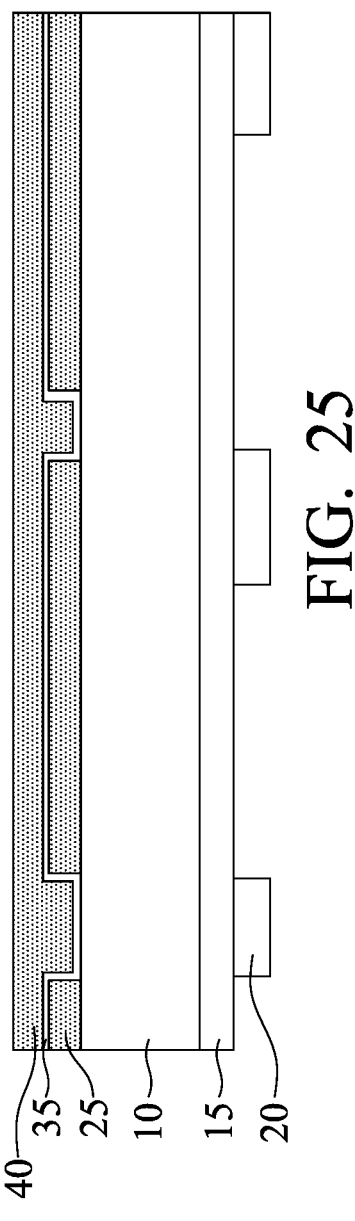
FIG. 25 shows a stage of a sequential manufacturing operation of a semiconductor device according to an embodiment of the present disclosure.

A second conductive layer 40 is subsequently formed over the first dielectric layer 35, as shown in FIG. 25. The second conductive layer 40 is conformally formed in some embodiments. In some embodiments, the second conductive layer 40 is planarized after it is deposited. The second conductive layer 40 may be formed of the same materials, to the same thicknesses, and in the same manner as the first conductive layer 25 disclosed herein.

Figure 26:
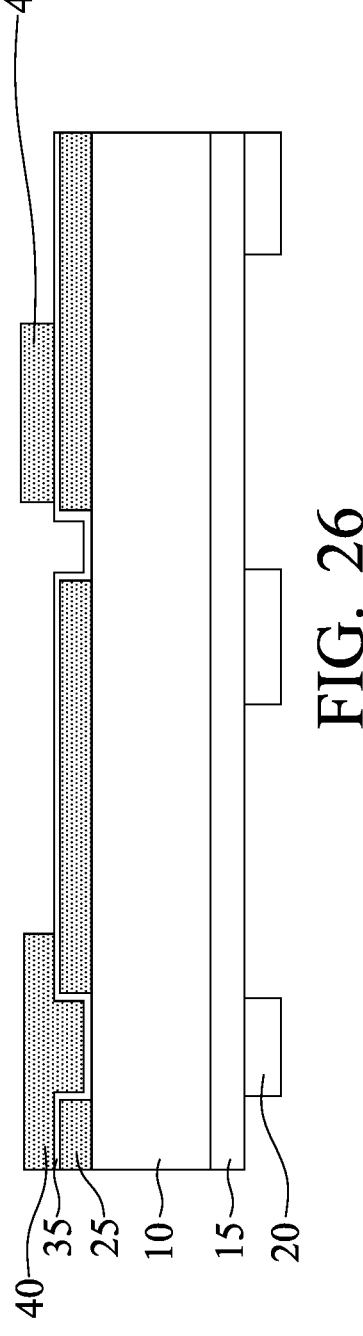
FIG. 26 shows a stage of a sequential manufacturing operation of a semiconductor device according to an embodiment of the present disclosure.

Next, the second conductive layer 40 is patterned to form a plate over a portion of the first dielectric layer 35 overlying the first region of first conductive layer 25a and another plate over another portion of the first dielectric layer 35 overlying second and third regions of the first conductive layer 25b, 25c, as shown in FIG. 26. The second conductive layer 40 is removed from other portions of the first dielectric layer 35 by suitable photolithography and etching operations.

Figure 27:
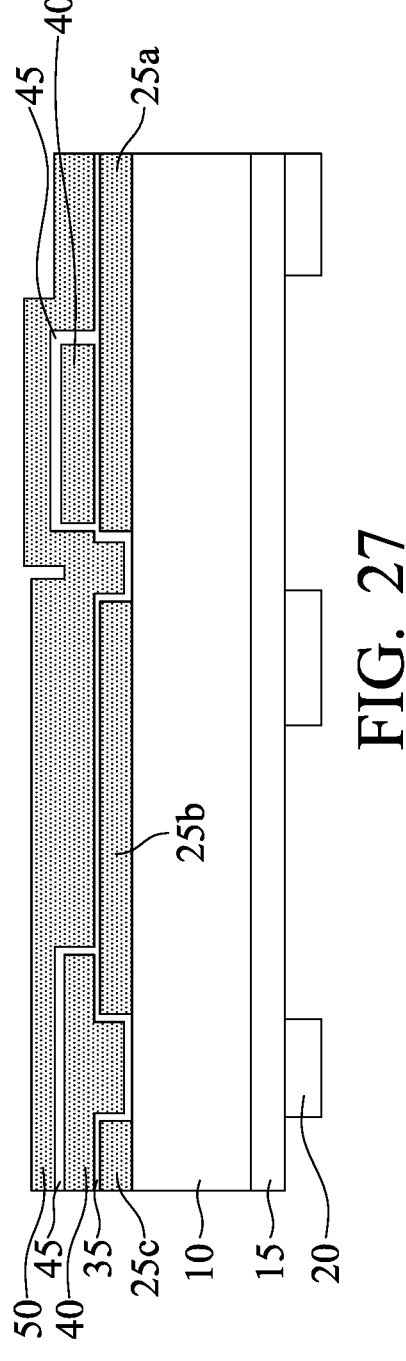
FIG. 27 shows a stage of a sequential manufacturing operation of a semiconductor device according to an embodiment of the present disclosure.

A second dielectric layer 45 is subsequently formed over the second conductive layer 40 and the first dielectric layer 35, as shown in FIG. 27. The second dielectric layer 45 may be conformally formed over the second conductive layer 40 and the first dielectric layer 35, and then the portion of the second dielectric layer 45 disposed over the first dielectric layer may be removed by suitable photolithography and etching operations. In some embodiments, the second dielectric layer 45 may remain overlying the first dielectric layer 35, thereby providing a thicker dielectric layer over those portions where two dielectric layers are formed. As shown, the second conductive layer 40 overlying the first region 25a of the first conductive layer is surrounded on four sides or completely surrounded by dielectric layers 35, 45 when viewed in cross section. The second conductive layer 40 may be formed by the same materials, same operations, and to the same thicknesses disclosed herein with respect to the first conductive layer 25. In some embodiments, the material and thickness of the second conductive layer 40 is the same as the first conductive layer 25, in other embodiments, the material or thickness of the second conductive layer 40 is different from the first conductive layer 25 depending on design requirements. Then, a third conductive layer 50 is formed over the first and second dielectric layers 35, 45. The third conductive layer 50 may be formed by the same materials, same operations, and to the same thicknesses disclosed herein with respect to the first and second conductive layers 25, 40. In some embodiments, the material and thickness of the third conductive layer 50 is the same as the first conductive layer 25 or second conductive layer 40, in other embodiments, the material or thickness of the third conductive layer 50 is different from the first conductive layer 25 or second conductive layer 40 depending on design requirements.

Figure 28:
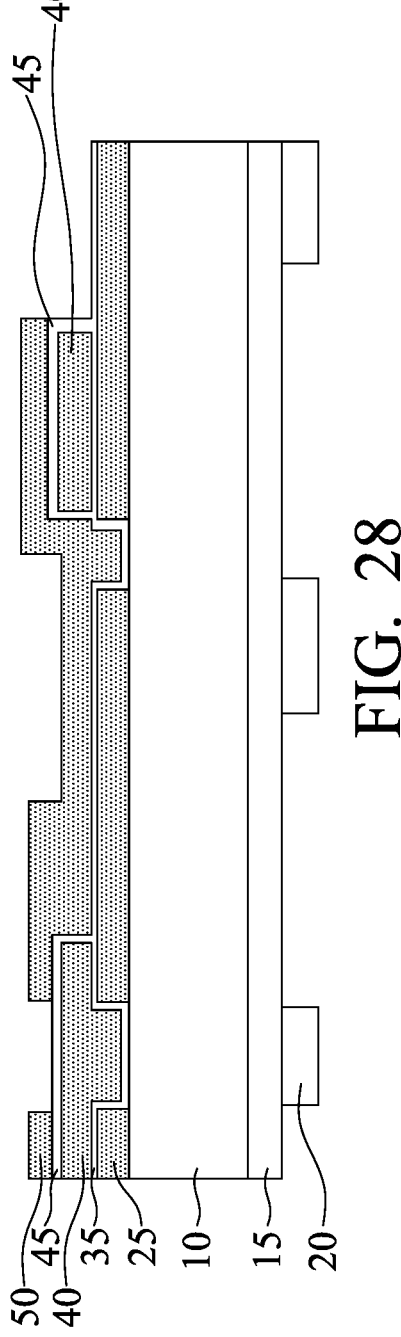
FIG. 28 shows a stage of a sequential manufacturing operation of a semiconductor device according to an embodiment of the present disclosure.

The third conductive layer 50 is subsequently patterned to form spaced apart top plates 50, as shown in FIG. 28. Suitable photolithography and etching operations may be used to pattern the third conductive layer.

Figure 29:
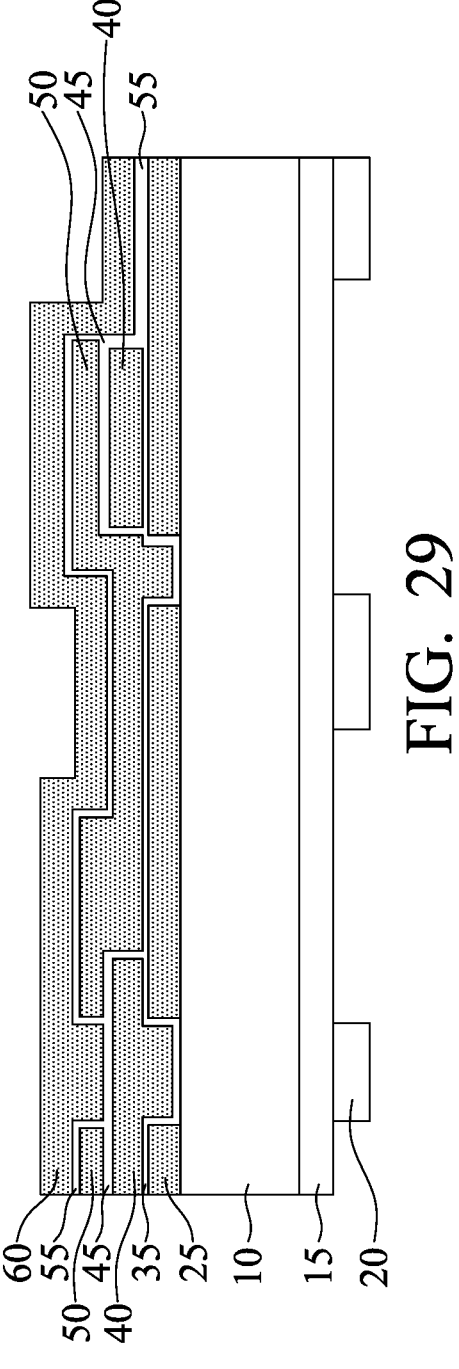
FIG. 29 shows a stage of a sequential manufacturing operation of a semiconductor device according to an embodiment of the present disclosure.

A third dielectric layer 55 is then formed over the third conductive layer 50, as shown in FIG. 29. In some embodiments, the third dielectric layer 55 is also formed over a portion of the first dielectric layer 35 and the second dielectric layer 45. Where the third dielectric layer 55 is formed over the first dielectric layer 35 or the second dielectric layer 45 the combined thickness of the dielectric layers is greater than either the first dielectric layer 35, second dielectric layer 45, or third dielectric layer 55 alone. In some embodiments, where the third dielectric layer 55 overlaps the first dielectric layer 35 or the second dielectric layer 45, the combined thickness of the dielectric layers is about the twice the thickness of the first dielectric layer 35. Then, in some embodiments, a fourth conductive layer 60 is formed over the third dielectric layer 55. The fourth conductive layer 60 and the third dielectric layer 55 are conformal layers in some embodiments. The third dielectric layer 55 may be formed by the same materials, same operations, and to the same thicknesses disclosed herein with respect to the first and second dielectric layers 35, 45. The fourth conductive layer 60 may be formed by the same materials, same operations, and to the same thicknesses as the first, second, and third conductive layers 25, 40, 50. In some embodiments, the third dielectric layer is made of different materials or to different thicknesses than the first or second dielectric layers 35, 45. In some embodiments, the fourth conductive layer 60 is made of different materials or to different thicknesses than the first, second, or third conductive layers 25, 40, 50. In some embodiments, one or more deposition and planarization operations are performed while forming the fourth conductive layer 60

Figure 30:
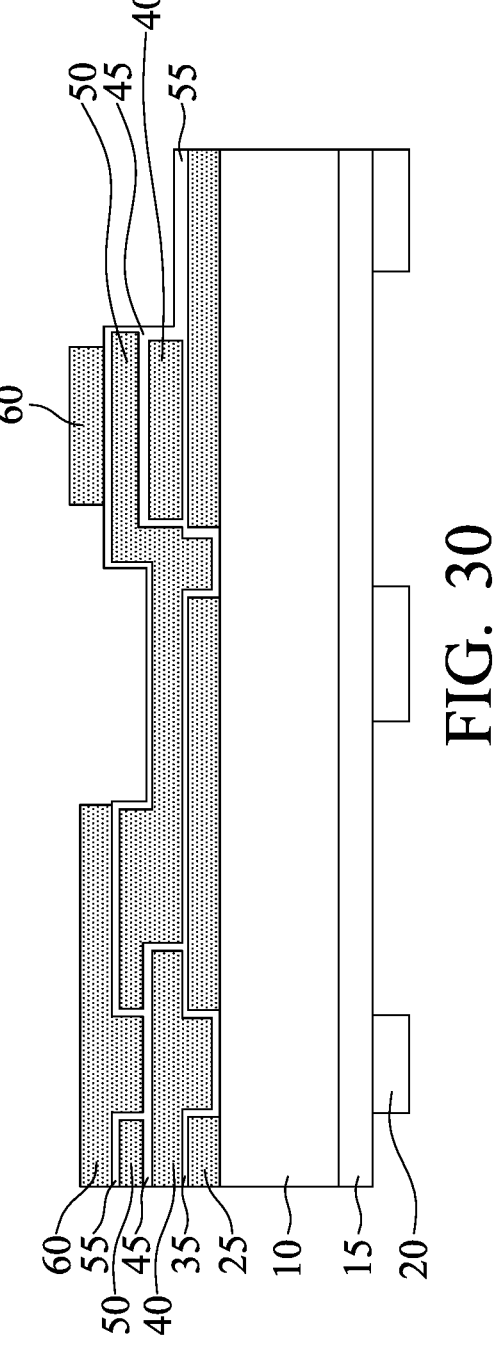
FIG. 30 shows a stage of a sequential manufacturing operation of a semiconductor device according to an embodiment of the present disclosure.

The fourth conductive layer 60 is then patterned, in some embodiments, to form a plurality of plates 60, as shown in FIG. 30. In some embodiments, one of the plates 60 is formed over a first portion of the first region 25a of the first conductive layer 25. In some embodiments, the plate 60 formed over the portion of the first region 25a of the first conductive layer is located over and is substantially vertically aligned with the plate 40 formed over the first region 25a of the first conductive layer 25.

Figure 31:
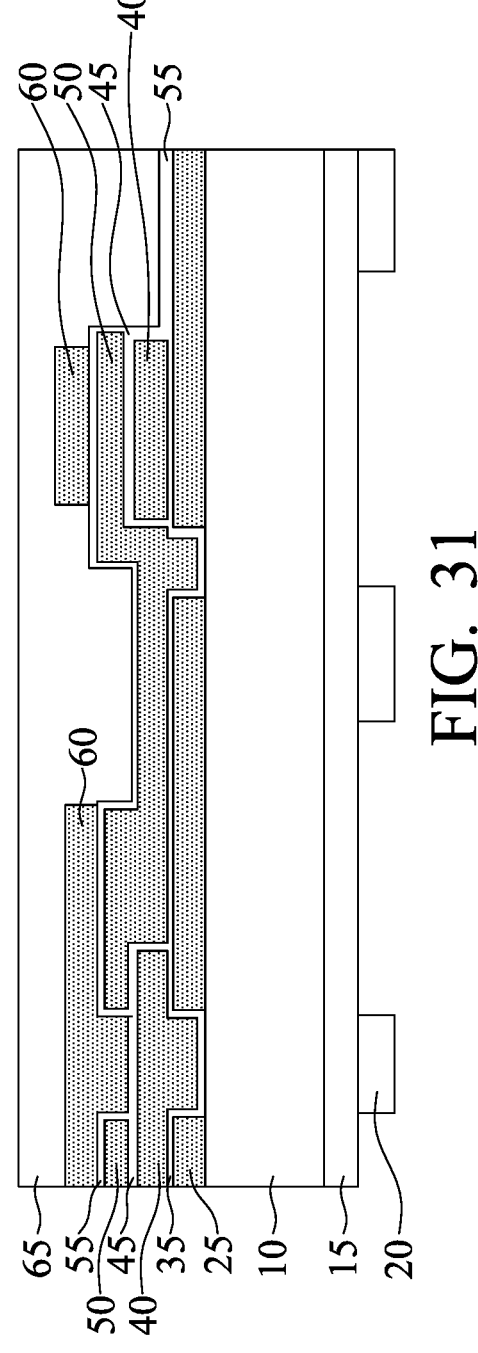
FIG. 31 shows a stage of a sequential manufacturing operation of a semiconductor device according to an embodiment of the present disclosure.

A second insulating layer (or upper insulating layer) 65 is formed over third dielectric layer 55 or the fourth conductive layer 60 in some embodiments, as shown in FIG. 31. The second insulating layer 65 may be formed of the same materials and by the same operations as disclosed herein with reference to FIG. 10.

Figures 32, 33:
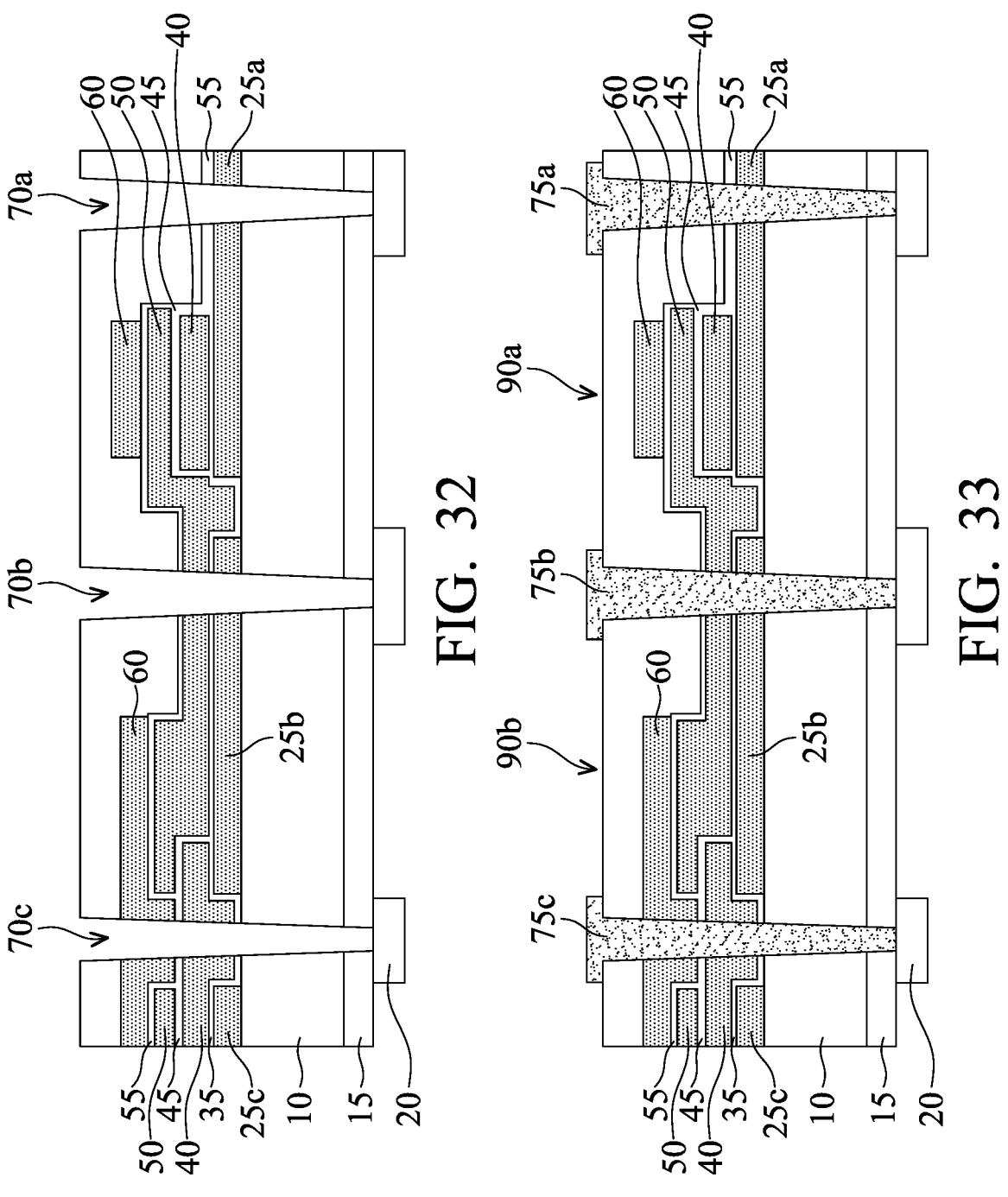
FIG. 32 shows a stage of a sequential manufacturing operation of a semiconductor device according to an embodiment of the present disclosure.
FIG. 33 shows a stage of a sequential manufacturing operation of a semiconductor device according to an embodiment of the present disclosure.

In some embodiments, first, second, and third openings 70a, 70b, 70c are formed in the device structure by suitable etching operations. As shown in FIG. 32, the openings 70a, 70b, 70c extend to the contact pads 20. By using suitable wet or dry etching operations, the upper insulating layer 65, first, second, and third dielectric layers 35, 45, 55, first, second, and third conductive layers 25, 40, 50, first insulating layer 10, and etch stop layer 15 are etched. Different etchants, selective to each layer being etched, are used in some embodiments.

The openings 70a, 70b, 70c are subsequently filled with a conductive material to form conductive vias 75a, 75b, 75c as shown in FIG. 33. Two MIM capacitor structures 90a, 90b are shown in FIG. 33. In some embodiments, the conductive vias may be formed of the same materials, and by the same operations as disclosed herein with reference to FIG. 12. The first conductive via 75a is in electrical contact with the first plate 25a of the first capacitor structure 90a. The second conductive via 75b is in electrical contact with the third plate 50 of the first capacitor structure 90a and second capacitor structure 90b and the first plate 25b of the second capacitor structure 90b. The third conductive via 75c is in electrical contact with the second plate 40 of the second capacitor structure 90b and the fourth plate 60 of the second capacitor structure 90b. The second plate 40 of the first capacitor structure 90a is not in electrical contact with either the first or second conductive via 75a, 75b, and is electrically floating.

As shown, the first capacitor structure 90a includes a floating plate 40 between the first and third plates 25, 50, while the second capacitor structure 90b does not include an intervening floating plate. The first capacitor structure 90a is used for higher voltage applications, such as the input/output region of a semiconductor device, while the second capacitor structure 90b is used for lower voltage applications, such as the core region of the semiconductor device in some embodiments. The first conductive via 75a is in electrical contact with the higher voltage section of a semiconductor device and the third conductive via 75c is in electrical contact with the lower voltage section of the semiconductor device. In some embodiments, the second conductive via 75b is connected to ground.

As shown, in some embodiments, the second capacitor structure 90b includes a plurality of capacitors in the core region, depending on the configuration of electrical connections with the conductive layers. For example, a capacitor may be formed by first conductive layer plate 25b, dielectric layer 35, and second conductive layer plate 40. Another capacitor may be formed by third conductive layer plate 50, dielectric layer 55, and fourth conductive layer plate 60. And another capacitor may be formed by first conductive layer plate 25b, dielectric layers 35, 55, and fourth conductive layer plate 60. The plurality of capacitors may be connected in series and the overall capacitance of the core region can be varied by varying the electrical connections to the plates of the one or more capacitors.

In some embodiments, a planarizing operation is subsequently performed on metal deposited on top of the upper insulating layer 65. In some embodiments, after the metal is deposited in the openings, a patterning operation is performed using suitable photolithography and etching operations to form contact pads on the upper surface of the insulating layer 65.

Other embodiments include other operations before, during, or after the operations described above. Such embodiments, further include etching the substrate through the openings of a patterned hard mask to form trenches in the substrate; filling the trenches with a dielectric material; performing a chemical mechanical polishing (CMP) process to form shallow trench isolation (STI) features; epitaxial deposition; dopant implantation; forming metal lines and interconnects; or planarization operations.

In some embodiments, the disclosed methods include forming additional devices on a main substrate, such as a silicon wafer. In some embodiments, an integrated circuit is formed on the silicon wafer including one or more MIM capacitors according to the present disclosure and a plurality of diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin field effect transistor (FinFET) structures, other three-dimensional (3D) FETs, memory cells, inductors, and combinations thereof. The above are non-limiting examples of devices/structures that can be made and/or improved using the method described herein.

Figure 34:
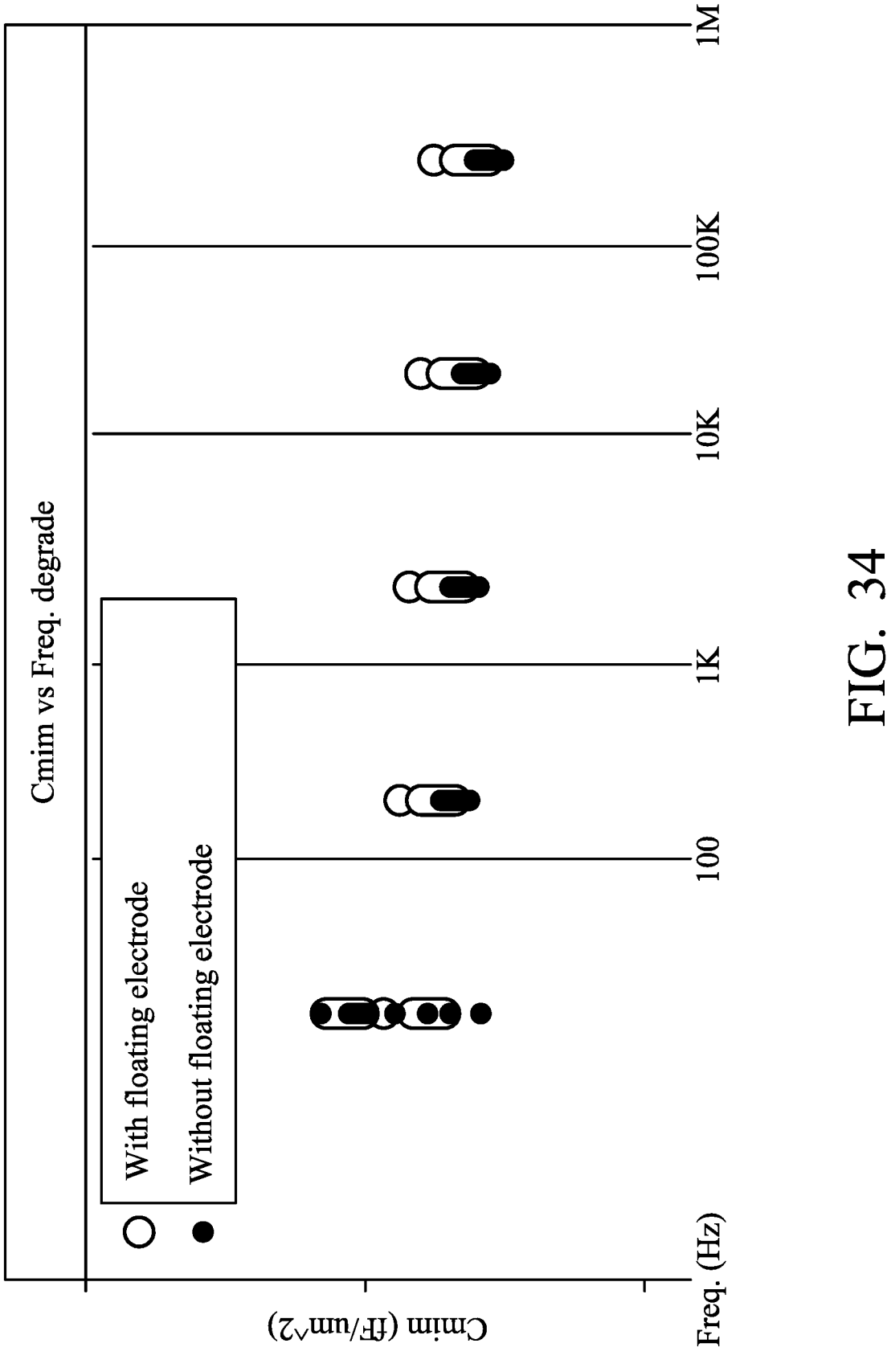
FIG. 34 shows frequency degradation versus capacitance of MIM capacitors according to embodiments of the disclosure.

MIM capacitors according to embodiments of the disclosure provide improved frequency degradation properties, as shown in FIG. 34. Over the frequency range of 100 Hz to 1 MHz, MIM capacitors with a floating plate interposed between the bottom and top plates according to embodiments of the disclosure provide about a 25% reduction in capacitance degradation over MIM capacitors without the floating plate.

MIM capacitors according to embodiments of the disclosure provide an unexpectedly improved time dependent dielectric breakdown. Thus, embodiments of the disclosure provide longer operating life. Some embodiments including a floating plate between the upper and lower metal plates have a projected operating lifetime of over 20 years, while similar capacitors without a floating plate between the upper and lower plates only have a projected operating lifetime of about 4 years. Thus, some embodiments of the disclosure provide about a 5× improvement in projected operating lifetime. Moreover, MIM capacitors according to the present disclosure have a higher operating voltage to lifetime slope than MIM capacitors without the floating plate.

Figures 35, 36:
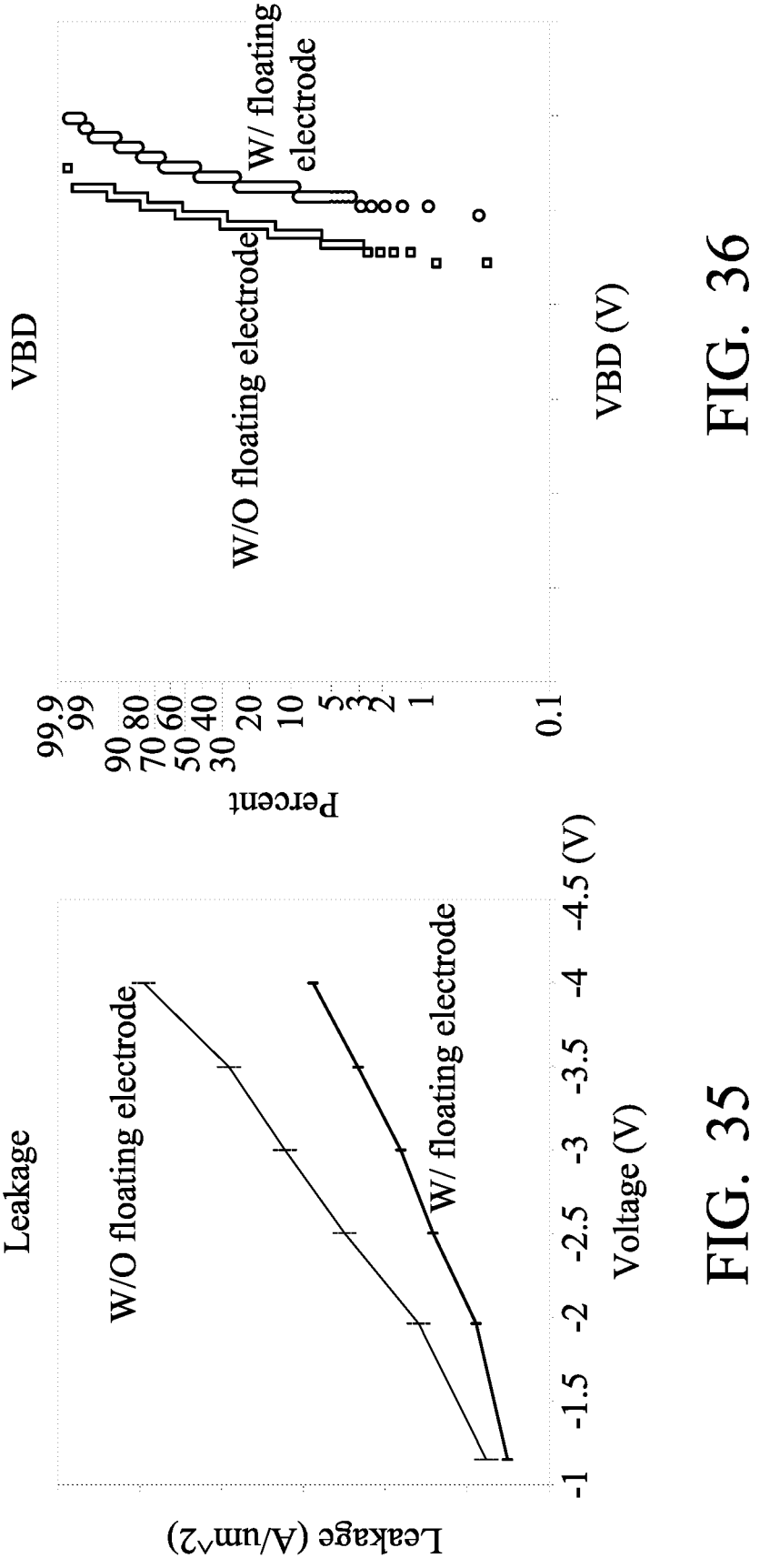
FIG. 35 shows voltage versus leakage current for MIM capacitors according to embodiments of the present disclosure.
FIG. 36 shows breakdown voltages of MIM capacitors according to embodiments of the disclosure.

As shown in FIG. 35, MIM capacitors having an intervening floating plate according to embodiments of the disclosure provide an unexpectedly significant reduction in leakage current at higher absolute values of voltage. In some embodiments, MIM capacitors having a floating plate between the bottom and top plates according to the present disclosure provide about a 10× to about a 1,000× reduction in leakage current over MIM capacitors without the floating plate.

Further, as shown in FIG. 36, MIM capacitors having the intervening floating plate provide an unexpectedly significant increase in the breakdown voltage. In some embodiments, MIM capacitors having a floating plate between the bottom and top plates according to the present disclosure provide about a 0.5 V increase in the breakdown over MIM capacitors without the floating plate.

An embodiment of the disclosure is a method of manufacturing a semiconductor device, including forming a first conductive layer over a first insulating layer and forming a first dielectric layer over the first conductive layer. A second conductive layer is formed over a first portion of the first dielectric layer. A second dielectric layer is formed over the second conductive layer. A third conductive layer is formed over the second dielectric layer and a second portion of the first dielectric layer. A third dielectric layer is formed over the third conductive layer. A first conductive contact is formed contacting the first conductive layer. A second conductive contact is formed contacting the third conductive layer. The second conductive layer is an electrically floating layer. In an embodiment, the method includes forming a fourth conductive layer over the third dielectric layer. In an embodiment, the method includes forming a second insulating layer over the fourth conductive layer and the third dielectric layer. In an embodiment, the second insulating layer is made of an oxide or nitride. In an embodiment, the method includes forming a fifth conductive layer over the second dielectric layer, and forming a fourth dielectric layer over the fifth conductive layer before forming the third conductive layer. In an embodiment, the third dielectric layer is formed over a first portion of the first dielectric layer. In an embodiment, the first insulating layer includes a first main surface and an opposing second main surface, the first conductive layer is formed over the first main surface, and one or more contact pads are formed over the second main surface. In an embodiment, the first conductive contact or the second conductive contact are in electrical contact with the one or more contact pads. In an embodiment, at least one of the first dielectric layer, the second dielectric layer, or the third dielectric layer are made of a high-k material.

Another embodiment of the disclosure is a method of manufacturing a semiconductor device, including forming a first plate layer having a first region and a second region over a first insulating layer, wherein the first region and the second region are electrically isolated from each other. A first dielectric layer is formed over the first region and the second region of the first plate layer. A second plate layer is formed over a first portion of the first region of the first dielectric layer. A second dielectric layer is formed over the second plate layer. A third plate layer is formed over the second dielectric layer and the first dielectric layer. A third dielectric layer is formed over the third plate layer. A first conductive via is formed in contact with the second region of the first plate layer and the third plate layer, and a second conductive via is formed in contact with the first region of the first plate layer. The second plate layer is a floating plate layer. In an embodiment, the first plate layer, the second plate layer, and the third plate layer are made of a material selected from the group consisting of Al, Cu, AlCu alloys, Ti, TiN, Ta, TaN, W, Co, Ni, and combinations thereof. In an embodiment, the first insulating layer includes a first main surface and an opposing second main surface, the first plate layer is formed over the first main surface, an etch stop layer is formed over the second main surface, and one or more contact pads are formed over the etch stop layer. In an embodiment, the method includes forming a fourth plate layer over the third dielectric layer; and forming a second insulating layer over the fourth plate layer and the third dielectric layer. In an embodiment, the forming the first conductive via and the second conductive via includes etching the second insulating layer, the third dielectric layer, the first plate layer, the first insulating layer, and the etch stop layer to form first and second openings; and depositing a metal in the first and second openings. In an embodiment, the metal is selected from the group consisting of Al, Cu, W, Ta, Ti, Ni, and alloys thereof. In an embodiment, the fourth plate layer is formed over the first portion of the first region of the first dielectric layer. In an embodiment, the method includes a forming a fifth plate layer over the second dielectric layer, and forming a fourth dielectric layer over the fifth plate layer before forming the third plate layer.

Another embodiment of the disclosure is a method of manufacturing a semiconductor device, including forming a first plate layer having a first region, a second region, and a third region over a first insulating layer, wherein the first region, the second region, and the third region are spaced apart from each other. A first dielectric layer is formed over the first region, the second region, and third region of the first plate layer. A second plate layer is formed over a first portion of the first region of the first dielectric layer, over a second portion of the second region, and over a third portion of the third region. A second dielectric layer is formed over the second plate layer. A third plate layer is formed over the second dielectric layer and the first dielectric layer over the first region. A third dielectric layer is formed over the third plate layer. A first conductive via is formed in contact with the first region of the first plate layer. A second conductive via is formed in contact with the second region of the first plate layer and the third plate layer, and a third conductive via is formed in contact with the second plate layer. In an embodiment, the third dielectric layer is formed in contact with a portion of the second dielectric layer and a portion of the first dielectric layer. In an embodiment, the first plate layer is formed over and in contact with a first main surface of the first insulating layer, and an etch stop layer is formed over and in contact with a second main surface of the first insulating layer. In an embodiment, the method includes forming a fourth plate layer over the third dielectric layer, wherein the fourth plate layer comprises a first part and a second part electrically isolated from each other, the first part is formed over the first region of the first plate layer, and the second part is formed over the second region of the first plate layer. In an embodiment, the method includes forming a second insulating layer over the fourth plate layer and the third dielectric layer.

Another embodiment of the disclosure is a semiconductor device, including a first conductive layer overlying a first insulating layer, wherein the first conductive layer includes a first region and a second region spaced apart from the first region. A first dielectric layer overlies the first region and the second region of the first conductive layer. A second conductive layer overlies a first part of the first region of the first conductive layer. A second dielectric layer overlies the second conductive layer and the first conductive layer. A third conductive layer overlies the first dielectric layer and the second dielectric layer. A third dielectric layer overlies the third conductive layer. A first conductive contact electrically contacts the first region of the first conductive layer, and a second conductive contact electrically contacts the second region of the first conductive layer and the third conductive layer. The second conductive layer is an electrically floating layer. In an embodiment, when viewed in cross section, the second conductive layer is surrounded by dielectric layers on four sides. In an embodiment, the semiconductor device includes a fourth conductive layer disposed over the third dielectric layer over the first part of the first region of the first conductive layer. In an embodiment, the semiconductor device includes a second insulating layer disposed over the fourth conductive layer and the third dielectric layer. In an embodiment, the first conductive contact and the second conductive contact are in direct contact with the first insulating layer, the first conductive layer, the first dielectric layer, and the second insulating layer. In an embodiment, the first insulating layer includes a first main surface and an opposing second main surface, the first conductive layer is disposed over the first main surface, and the semiconductor device further comprises two spaced apart contact pads disposed over the second main surface, wherein the first conductive contact is in electrical contact with one of the two spaced apart contact pads, and the second conductive contact is in electrical contact with another of the two spaced apart contact pads. In an embodiment, the at least one of the first dielectric layer, the second dielectric layer, and the third dielectric layer are made of a high-k material. In an embodiment, the semiconductor device includes an electrically floating fifth conductive layer disposed between the second conductive layer and the third conductive layer.

Another embodiment of the disclosure is a semiconductor device, including a first plate layer having a first region and a second region disposed over a first insulating layer, wherein the first region and the second region are electrically isolated from each other. A first dielectric layer is disposed over the first region and the second region of the first plate layer. A second plate layer is disposed over a first portion of the first region of the first dielectric layer. A second dielectric layer is disposed over the second plate layer. A third plate layer is disposed over the second dielectric layer and the first dielectric layer. A third dielectric layer is disposed over the third plate layer. A first conductive via is in electrical contact with the second region of the first plate layer and the third plate layer, and a second conductive via is in electrical contact with the first region of the first plate layer. The second plate layer is a floating layer. In an embodiment, the semiconductor device includes a fourth plate layer disposed over the third dielectric layer over the first portion of the first region of the first plate layer. In an embodiment, the semiconductor device includes a second insulating layer disposed over the fourth plate layer and the third dielectric layer. In an embodiment, the first insulating layer and the second insulating layer are formed of an oxide, nitride, or combinations thereof. In an embodiment, the first conductive via and the second conductive via are in direct contact with the first insulating layer, the first plate layer, the first dielectric layer, and the second insulating layer. In an embodiment, the fourth plate layer is electrically isolated from the first conductive via and the second conductive via. In an embodiment, the first plate layer, the second plate layer, and the third plate layer are made of a metal selected from the group consisting of Al, Cu, W, Ta, Ti, NI, and alloys thereof. In an embodiment, the semiconductor device includes an electrically floating fifth plate layer disposed between the second plate layer and the third plate layer.

Another embodiment of the disclosure is a semiconductor device, including a first capacitor structure, including: a first plate disposed over a first insulating layer, a first dielectric layer disposed over the first plate, a floating plate disposed over a first part of the first dielectric layer, a second dielectric layer disposed over the floating plate, a second plate disposed over the first dielectric layer and the second dielectric layer, and a third dielectric layer disposed over the second plate. The semiconductor device includes a second capacitor structure, including a third plate disposed over the first insulating layer, a fourth dielectric layer disposed over the third plate, a fourth plate disposed over the fourth dielectric layer, and a fifth dielectric layer disposed over the fourth dielectric layer. A first conductive via electrically contacts the first plate, a second conductive via electrically contacts the second plate and the third plate. In an embodiment, the semiconductor device includes a fifth plate disposed over the third dielectric layer over the second plate. In an embodiment, the semiconductor device includes a sixth plate disposed over the fifth dielectric layer. In an embodiment, the semiconductor device includes a second insulating layer disposed over the first capacitor structure and the second capacitor structure. In an embodiment, the first insulating layer has a first main surface and an opposing second main surface, wherein the first main surface is in direct contact with the first plate and the third plate; an etch stop layer disposed over the second main surface; and a first contact pad, a second contact pad, and a third contact pad disposed over the etch stop layer, wherein the first contact pad, the second contact pad, and the third contact pad are spaced apart from each other, wherein the first contact pad is in electrical contact with the first conductive via, the second contact pad is in electrical contact with the second conductive via, and the third contact pad is in electrical contact with a third conductive via. In an embodiment, the floating plate is surrounded by dielectric layers on four sides when viewed in cross section.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a first conductive layer over a first insulating layer;

forming a first dielectric layer over the first conductive layer;

forming a second conductive layer over a first portion of the first dielectric layer;

forming a second dielectric layer over the second conductive layer;

forming a third conductive layer over the second dielectric layer and a second portion of the first dielectric layer, wherein the first portion of the first dielectric layer and the second portion of the first dielectric layer are separated by a third portion of the first dielectric layer, wherein the third conductive layer and the third portion of the first dielectric layer are disposed in an opening in the first conductive layer;

forming a third dielectric layer over the third conductive layer, wherein the third dielectric layer is directly in contact with the first portion of the first dielectric layer and the second dielectric layer;

forming a first conductive contact contacting the first conductive layer; and forming a second conductive contact contacting the third conductive layer, wherein the second conductive layer is an electrically floating layer.

2. The method according to claim 1, further comprising forming a fourth conductive layer over the third dielectric layer.

3. The method according to claim 2, further comprising forming a second insulating layer over the fourth conductive layer and the third dielectric layer.

4. The method according to claim 3, wherein the second insulating layer is made of an oxide or nitride.

5. The method according to claim 1, further comprising:

forming a fourth conductive layer over the second dielectric layer; and forming a fourth dielectric layer over the fourth conductive layer before forming the third conductive layer.

6. The method according to claim 1, wherein:

the first insulating layer includes a first main surface and an opposing second main surface, the first conductive layer is formed over the first main surface, one or more contact pads are formed over the opposing second main surface, and the first conductive contact or the second conductive contact are in electrical contact with the one or more contact pads.

7. The method according to claim 1, wherein at least one of the first dielectric layer, the second dielectric layer, or the third dielectric layer is made of a high-k material.

8. A method of manufacturing a semiconductor device, comprising:

forming a first plate layer having a first region and a second region over a first insulating layer, wherein the first region and the second region are electrically isolated from each other;

forming a first dielectric layer over the first region and the second region of the first plate layer, wherein the first dielectric layer is disposed in an opening between the first region and the second region of the first plate layer;

forming a second plate layer over a first portion of the first region of the first plate layer;

forming a second dielectric layer over the second plate layer;

forming a third plate layer over the second dielectric layer and the first dielectric layer;

forming a third dielectric layer over the third plate layer, wherein the third dielectric layer is directly in contact with a portion of the first dielectric layer on the first portion of the first region of the first plate layer and the second dielectric layer;

forming a fourth plate layer over the third dielectric layer, wherein the fourth plate layer is disposed in the opening between the first region and the second region of the first plate layer;

forming a first conductive via in contact with the second region of the first plate layer and the third plate layer; and forming a second conductive via in contact with the first region of the first plate layer, wherein the second plate layer is a floating layer.

9. The method according to claim 8, wherein the first plate layer, the second plate layer, and the third plate layer are made of a material selected from the group consisting of Al, Cu, AlCu alloys, Ti, TiN, Ta, TaN, W, Co, Ni, and combinations thereof.

10. The method according to claim 8, wherein:

the first insulating layer comprises a first main surface and an opposing second main surface, the first plate layer is formed over the first main surface, an etch stop layer is formed over the opposing second main surface, and one or more contact pads are formed over the etch stop layer.

11. The method according to claim 10, further comprising:

forming a fourth plate layer over the third dielectric layer; and forming a second insulating layer over the fourth plate layer and the third dielectric layer.

12. The method according to claim 11, wherein the forming the first conductive via and the second conductive via comprises:

etching the second insulating layer, the third dielectric layer, the first plate layer, and the first insulating layer, and the etch stop layer to form first and second openings; and depositing a metal in the first and second openings.

13. The method according to claim 12, wherein the metal is selected from the group consisting of Al, Cu, W, Ta, Ti, Ni, and alloys thereof.

14. The method according to claim 8, further comprising:

forming a fourth plate layer over the second dielectric layer; and forming a fourth dielectric layer over the fourth plate layer before forming the third plate layer.

15. A method of manufacturing a semiconductor device, comprising:

forming a first conductive layer overlying a first insulating layer;

forming a first dielectric layer overlying the first conductive layer, wherein a first portion of the first dielectric layer is disposed in an opening between a first region of the first conductive layer and a second region of the first conductive layer;

forming a second conductive layer overlying the first region of the first conductive layer;

forming a second dielectric layer overlying the second conductive layer and the first conductive layer;

forming a third conductive layer overlying the second dielectric layer and the second conductive layer;

forming a third dielectric layer overlying the third conductive layer, wherein the third dielectric layer is directly in contact with a second portion of the first dielectric layer over the first region of the first conductive layer and the second dielectric layer;

forming a fourth conductive layer overlying the first conductive layer, the first dielectric layer, the third conductive layer, and the third dielectric layer, wherein the fourth conductive layer is disposed in the opening between the first region of the first conductive layer and the second region of the first conductive layer;

forming a first conductive contact electrically contacting the first conductive layer; and forming a second conductive contact electrically contacting the first conductive layer and the fourth conductive layer, wherein the second conductive layer and the third conductive layer are electrically floating layers.

16. The method according to claim 15, further comprising:

forming a fourth dielectric layer over the fourth conductive layer.

17. The method according to claim 16, further comprising forming a fifth conductive layer over a part of the fourth dielectric layer and a part of the fourth conductive layer.

18. The method according to claim 17, further comprising a second insulating layer over the fourth dielectric layer and the fifth conductive layer.

19. The method according to claim 15, wherein the first insulating layer includes a first main surface and an opposing second main surface, and the first conductive layer is formed over the first main surface, and the method further comprises forming one or more contact pads over the opposing second main surface.

20. The method according to claim 2, wherein:

the fourth conductive layer is aligned with the second conductive layer.

*   *   *   *   *